United States Patent
Wong et al.

(10) Patent No.: US 8,664,075 B2
(45) Date of Patent: Mar. 4, 2014

(54) HIGH CAPACITANCE TRENCH CAPACITOR

(71) Applicant: International Business Machines Corporation, Armonk, NY (US)

(72) Inventors: Keith Kwong Hon Wong, Wappingers Falls, NY (US); Ramachandra Divakaruni, Ossining, NY (US); Roger A. Booth, Jr., Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/788,980

(22) Filed: Mar. 7, 2013

(65) Prior Publication Data

US 2013/0183805 A1 Jul. 18, 2013

Related U.S. Application Data

(62) Division of application No. 12/881,481, filed on Sep. 14, 2010.

(51) Int. Cl.
*H01L 27/108* (2006.01)
*H01L 21/20* (2006.01)

(52) U.S. Cl.
USPC ........... 438/387; 438/386; 257/301; 257/304; 257/E29.346

(58) Field of Classification Search
USPC .................. 257/301–304, E29.343, E29.345, 257/E29.346; 438/386, 387
See application file for complete search history.

(56) References Cited

U.S. PATENT DOCUMENTS

| | | | |
|---|---|---|---|
| 5,237,528 A | 8/1993 | Sunami et al. | |
| 6,278,149 B1 | 8/2001 | Sato et al. | |
| 6,617,208 B2 | 9/2003 | Saran | |
| 6,753,193 B2 | 6/2004 | Kim | |
| 6,867,467 B2 | 3/2005 | Yang et al. | |
| 7,138,677 B2 | 11/2006 | Gutsche et al. | |
| 7,560,795 B2 | 7/2009 | Kim | |
| 7,763,520 B2 | 7/2010 | Ahrens et al. | |
| 7,924,356 B2 | 4/2011 | Kamijima et al. | |
| 2008/0001201 A1 | 1/2008 | Weis | |
| 2008/0291601 A1* | 11/2008 | Roozeboom et al. | 361/306.2 |
| 2010/0155801 A1 | 6/2010 | Doyle et al. | |
| 2011/0073994 A1 | 3/2011 | Lin et al. | |

FOREIGN PATENT DOCUMENTS

| | | |
|---|---|---|
| JP | 01179443 A | 7/1989 |
| JP | 08186237 A | 7/1996 |
| JP | 2005322914 A | 11/2005 |

* cited by examiner

*Primary Examiner* — Matthew E Warren
(74) *Attorney, Agent, or Firm* — Scully, Scott, Murphy & Presser, P.C.; Katherine S. Brown, Esq.

(57) ABSTRACT

A dual node dielectric trench capacitor includes a stack of layers formed in a trench. The stack of layers include, from bottom to top, a first conductive layer, a first node dielectric layer, a second conductive layer, a second node dielectric layer, and a third conductive layer. The dual node dielectric trench capacitor includes two back-to-back capacitors, which include a first capacitor and a second capacitor. The first capacitor includes the first conductive layer, the first node dielectric layer, the second conductive layer, and the second capacitor includes the second conductive layer, the second node dielectric layer, and the third conductive layer. The dual node dielectric trench capacitor can provide about twice the capacitance of a trench capacitor employing a single node dielectric layer having a comparable composition and thickness as the first and second node dielectric layers.

20 Claims, 24 Drawing Sheets

HIGH CAPACITANCE TRENCH CAPACITOR

CROSS REFERENCE TO RELATED APPLICATION

This application is a divisional of U.S. patent application Ser. No. 12/881,481 filed on Sep. 14, 2010, the entire content and disclosure of which are incorporated herein by reference.

BACKGROUND

The present disclosure relates to a semiconductor structure, and particularly to a trench capacitor structure including dual node dielectric layers and methods of manufacturing the same.

Deep trench capacitors are used in a variety of semiconductor chips for high areal capacitance and low device leakage. Typically, a deep trench capacitor provides a capacitance in the range from 4 fF (femto-Farad) to 120 fF. A deep trench capacitor can be employed as a charge storage unit in a dynamic random access memory (DRAM), which can be provided as a stand-alone semiconductor chip, or can be embedded in a system-on-chip (SoC) semiconductor chip. A deep trench capacitor can also be employed in a variety of circuit applications such as a charge pump or a capacitive analog component in a radio-frequency (RF) circuit.

Deep trench capacitors are formed in a semiconductor substrate, which can be a semiconductor-on-insulator (SOI) substrate or a bulk substrate. Other semiconductor devices such as field effect transistors can be formed on the same semiconductor substrate, thereby enabling embedding of deep trench capacitors into a semiconductor chip. Such embedded deep trench capacitors enable various functionality including embedded dynamic access memory (eDRAM) and other embedded electronic components requiring a capacitor.

While deep trench capacitors provide a high capacitance per unit area, scaling of deep trench capacitors is difficult because maintaining the depth of a deep trench becomes more difficult as the lateral dimension of the deep trench are reduced. Thus, the capacitance per unit area of a deep trench capacitor employing a conventional structure has a limit. However, a capacitor structure having a greater capacitance per unit area than currently available would free up more area for other semiconductor devices, and thereby increase the device density in integrated semiconductor circuits.

BRIEF SUMMARY

A dual node dielectric trench capacitor includes a stack of layers formed in a trench. The stack of layers includes, from bottom to top, a first conductive layer, a first node dielectric layer, a second conductive layer, a second node dielectric layer, and a third conductive layer. The dual node dielectric trench capacitor includes two back-to-back capacitors, which include a first capacitor and a second capacitor. The first capacitor includes the first conductive layer, the first node dielectric layer, the second conductive layer, and the second capacitor includes the second conductive layer, the second node dielectric layer, and the third conductive layer. The first conductive layer and the third conductive layer can be electrically connected, in which case the dual node dielectric trench capacitor is a two-node capacitor structure. The dual node dielectric trench capacitor can provide about twice the capacitance of a trench capacitor employing a single node dielectric layer having a comparable composition and thickness as the first and second node dielectric layers.

According to an aspect of the present disclosure, a structure including a capacitor structure is provided. The capacitor structure includes: a trench located in a substrate; a first conductive layer contiguously contacting a bottom surface and sidewalls of the trench; a first node dielectric layer contiguously contacting sidewalls of the first conductive layer; a second conductive layer contiguously contacting sidewalls of the first node dielectric layer; a second node dielectric layer contiguously contacting sidewalls of the second conductive layer; and a third conductive layer contiguously contacting sidewalls of the second node dielectric layer.

According to another aspect of the present disclosure, a method of forming a structure including a capacitor structure is provided. The method includes: forming a trench in a substrate; forming a first conductive layer contiguously contacting a bottom surface and sidewalls of the trench; forming a first node dielectric layer contiguously contacting sidewalls of the first conductive layer; forming a second conductive layer contiguously contacting sidewalls of the first node dielectric layer; forming a second node dielectric layer contiguously contacting sidewalls of the second conductive layer; and forming a third conductive layer contiguously contacting sidewalls of the second node dielectric layer, wherein the first conductive layer, the first node dielectric layer, the second conductive layer, the second node dielectric layer, and the third conductive layer collectively form a capacitor structure.

DETAILED DESCRIPTION

Figure 1:
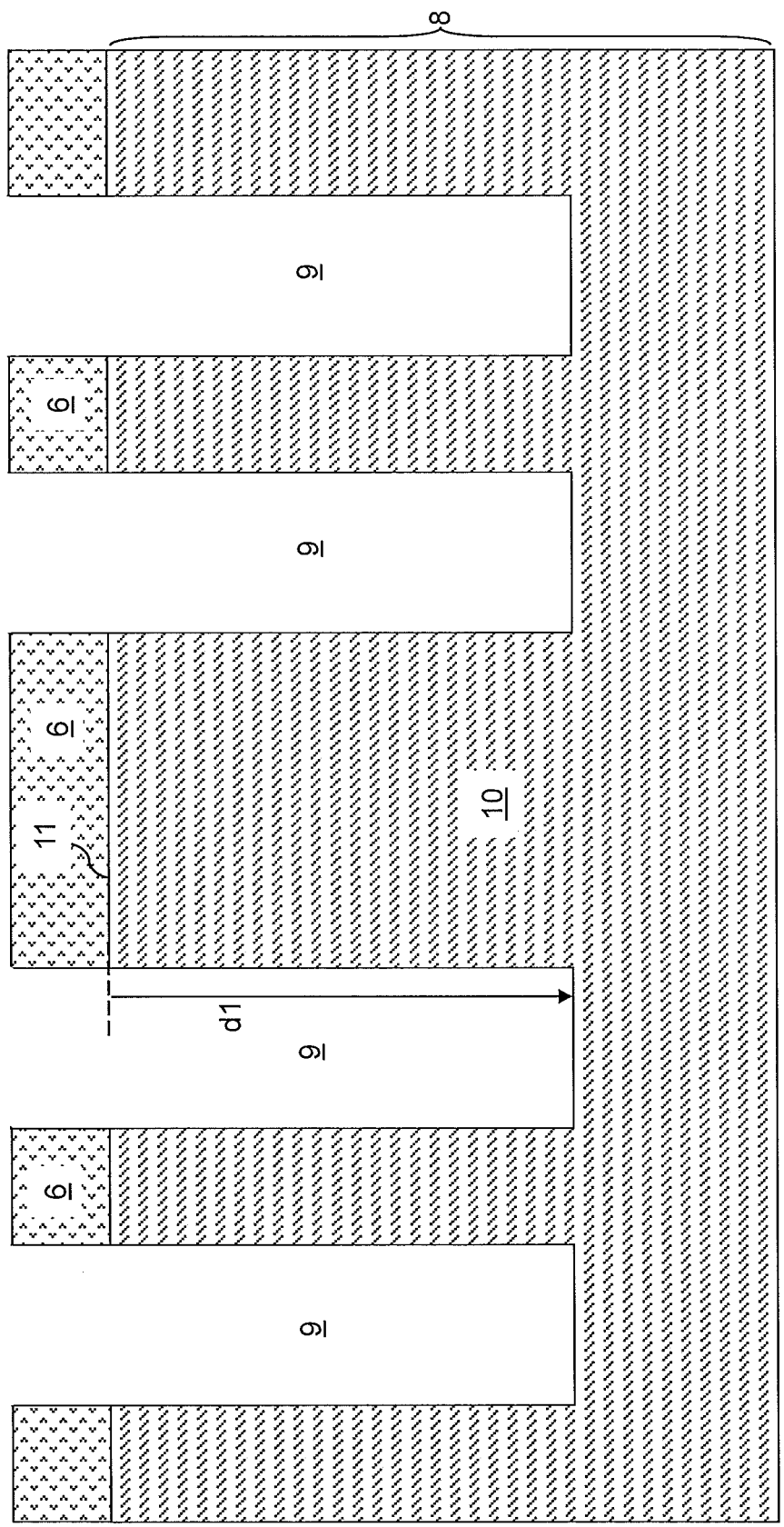
FIGS. 1-11 are sequential vertical cross-sectional views of a first exemplary structure according to a first embodiment of the present disclosure.

As stated above, the present disclosure relates to a trench capacitor structure including dual node dielectric layers and methods of manufacturing the same, which is now described in detail with accompanying figures. It is noted that like reference numerals refer to like elements across different embodiments. The drawings are not necessarily drawn to scale.

As used herein, a "deep trench" is a trench that extends from a top surface of a semiconductor-on-insulator substrate to a depth below a bottom surface of a buried insulator layer as applied to a semiconductor-on-insulator substrate, or a trench that extends from a top surface of a bulk substrate and having a depth greater than 1 micron.

As used herein, a first element is "electrically connected" or "electrically shorted" to a second element if the voltage at said first element is the same as the voltage at said second element under all operating conditions of said first element and said second element.

As used herein, a first element is "electrically isolated" from a second element if the voltage at said first element is not affected by the voltage at said second element under all operating conditions of said first element and said second element.

As used herein, a "conductive" element has an electrical conductivity that is greater than $10^3$ siemens per centimeter.

As used herein, a "refractive metal" refers to Ti, V, Cr, Zr, Nb, Mo, Ru, Rh, Hf, Ta, W, Re, Os, Ir, and alloys thereof.

Referring to FIG. 1, a first exemplary structure according to a first embodiment of the present disclosure includes a substrate 8, a mask layer 6, and at least one deep trench 9. The substrate 8 includes at least a substrate material layer 10 that includes a material having an electrical conductivity less than $10^3$ siemens per centimeter (which is the same as $10^3$/Ohm-cm).

In one embodiment, the substrate material layer 10 is a semiconductor material layer having an electrical conductivity from $10^{-8}$ siemens per centimeter to $10^3$ siemens per centimeter. For example, if the semiconductor material layer is a silicon layer, the semiconductor material layer can be an intrinsic silicon layer having an electrical conductivity less than $10^{-2}$ siemens per centimeter. Alternately, the semiconductor material layer can be a p-doped silicon layer or an n-doped silicon layer having a dopant concentration from about $10^{14}/cm^3$ to about $10^{20}/cm^3$ (corresponding to an electrical conductivity range from about $10^{-2}$ siemens per centimeter to $10^3$ siemens per centimeter), and preferably from about $10^{14}/cm^3$ to about $10^{17}/cm^3$ (corresponding to an electrical conductivity range from about $10^{-2}$ siemens per centimeter to 10 siemens per centimeter). Alternately, the semiconductor material layer can include any other semiconductor material such as, but not limited to, germanium, a silicon-germanium alloy, a silicon-carbon alloy, a silicon-germanium-carbon alloy, gallium arsenide, indium arsenide, indium phosphide, III-V compound semiconductor materials, II-VI compound semiconductor materials, organic semiconductor materials, or other compound semiconductor materials. Further, in case the substrate material layer 10 is a semiconductor material layer, the semiconductor material layer can be single crystalline, polycrystalline, amorphous, or have a combination of at least two of a single crystalline portion, a polycrystalline portion, and an amorphous portion. In an example, the substrate 8 can be a silicon substrate, in which case the substrate material layer 10 is a single crystalline silicon layer.

In another embodiment, the substrate material layer 10 can include an insulator material having an electrical conductivity less than $10^{-8}$ siemens per centimeter. For example, the insulator material can be silicon oxide, silicon nitride, or any other dielectric material. Further, the substrate material layer 10 can be a combination of at least one semiconductor layer and at least one insulator layer as in the case of a semiconductor-on-insulator substrate. The substrate 8 may, or may not, include an additional layer (not shown) underneath the substrate material layer 10. If an additional layer is present, the additional layer can be a conductive material layer, a semiconductor material layer, a dielectric material layer, or a combination thereof.

At least one deep trench 9 is formed in the substrate material layer 10. The at least one deep trench 9 can be formed by employing methods known in the art. Each of the at least one deep trench 9 has substantially vertical sidewalls and can have a substantially horizontal bottom surface. Typically, the substantially vertical sidewalls of the at least one deep trench 9 has a taper angle of less than 5 degrees, and preferably less than 2 degrees, and more preferably less than 1 degree. The taper angle is measured from a vertical line that is perpendicular to the top surface 11 of the substrate 8.

An exemplary method that can be employed to form the at least one deep trench 9 is described below. A mask layer 6 can be formed on the top surface 11 of the substrate 8, which is a planar horizontal surface before formation of the at least one deep trench 9. The mask layer 6 can be composed of a dielectric oxide, a dielectric nitride, a dielectric oxynitride, or a combination thereof. The dielectric oxide can be undoped silicate glass or a doped silicate glass such as borosilicate glass (BSG), borophosphosilicate glass (BPSG), phosphosilicate glass (PSG), a fluorosilicate glass (FSG), or a combination thereof. Examples of the dielectric nitride and the dielectric oxynitride include silicon nitride and silicon oxynitride. The mask layer 6 can include a stack of a silicon oxide layer (not shown separately) contacting a top surface of the top semiconductor layer 30 and a silicon nitride layer (not shown separately) located directly on the silicon oxide layer. Typically, the mask layer 6 can be formed by chemical vapor deposition (CVD) such as low pressure chemical vapor deposition (LPCVD), rapid thermal chemical vapor deposition (RTCVD), plasma enhanced chemical vapor deposition (PECVD), high density plasma chemical vapor deposition (HDPCVD), etc. The thickness of the mask layer 6 can be from 500 nm to 3,000 nm, and typically from 800 nm to 1,500 nm, although lesser and greater thicknesses can also be employed.

A photoresist (not shown) is subsequently applied over the mask layer 6. A lithographic pattern including at least one opening is formed in the photoresist by lithographic exposure and development. A horizontal cross-sectional shape of each of the at least one opening can be a circle, an ellipse, a polygon, or a derivative a polygon derived by rounding corners thereof. A characteristic lateral dimension of the shape of each opening is limited by the printing capability of a lithographic tool employed to pattern the opening. The characteristic lateral dimension can be a diameter of a circle, a minor axis of an ellipse, a distance between two facing sides of a polygon or a derivative thereof, or a distance that can otherwise characterize a separation distance between different sides of the shape.

The pattern of each opening in the photoresist is transferred by an anisotropic etch into the mask layer 6 to form at least one opening. During the anisotropic etch that removes exposed portions of the mask layer 6, the photoresist is employed as an etch mask. The width of the at least one opening in the mask layer 6 is typically comparable with the characteristic lateral dimension of an overlying opening in the photoresist. The width of the opening in the mask layer 6 can be from 40 nm to 200 nm, which is also the characteristic lateral dimension of the overlying opening in the photoresist. The photoresist is subsequently removed selective to the mask layer 6, for example, by ashing.

The pattern in the mask layer 6 is further transferred into an upper portion of the substrate material layer 10, for example, by another anisotropic etch. Exposed portions of the substrate material layer 10 are removed from underneath the at least one opening in the mask layer 6 during the anisotropic etch to form the at least one deep trench 9 therein. The anisotropic etch of the substrate material layer 10 can be performed either before or after removal of the photoresist. If the pattern in the mask layer 6 is transferred into the substrate material layer 10 before removal of the photoresist, the photoresist functions an etch mask. If the pattern in the mask layer 6 is transferred into the top semiconductor layer after removal of the photoresist, the mask layer 6 functions an etch mask. The buried insulator layer 30 can be employed as a stopping layer for the anisotropic etch. The trench 12' is a shallow trench that vertically extends from a top surface of the top semiconductor layer 30 to a bottom surface of the top semiconductor layer 30. The depth of the trench 12' as measured from the top surface of the top semiconductor layer 30 can be the same as the thickness of the top semiconductor layer 30.

A first depth d1 of the at least one deep trench 9, as measured vertically from the top surface 11 of the substrate 8 to a bottom surface of the at least one deep trench 9, can be from 1 micron to 10 microns, and typically from 2 microns to 8 microns. Preferably, the electrical conductivity of the substrate material layer 10 is not increased above the level of the electrical conductivity of the substrate material layer 10 as originally provided. For example, maintaining the electrical conductivity of the substrate material layer 10 can be effected by not implanting any dopant into the substrate material layer 10 if the substrate material layer 10 includes a semiconductor material. Any remaining portion of the photoresist, if any, and the mask layer 6 are subsequently removed selected to the material of the substrate material layer 10. If the substrate material layer 10 is a semiconductor layer, the at least one deep trench 9 is located in the semiconductor layer in the substrate 8.

Figure 2:
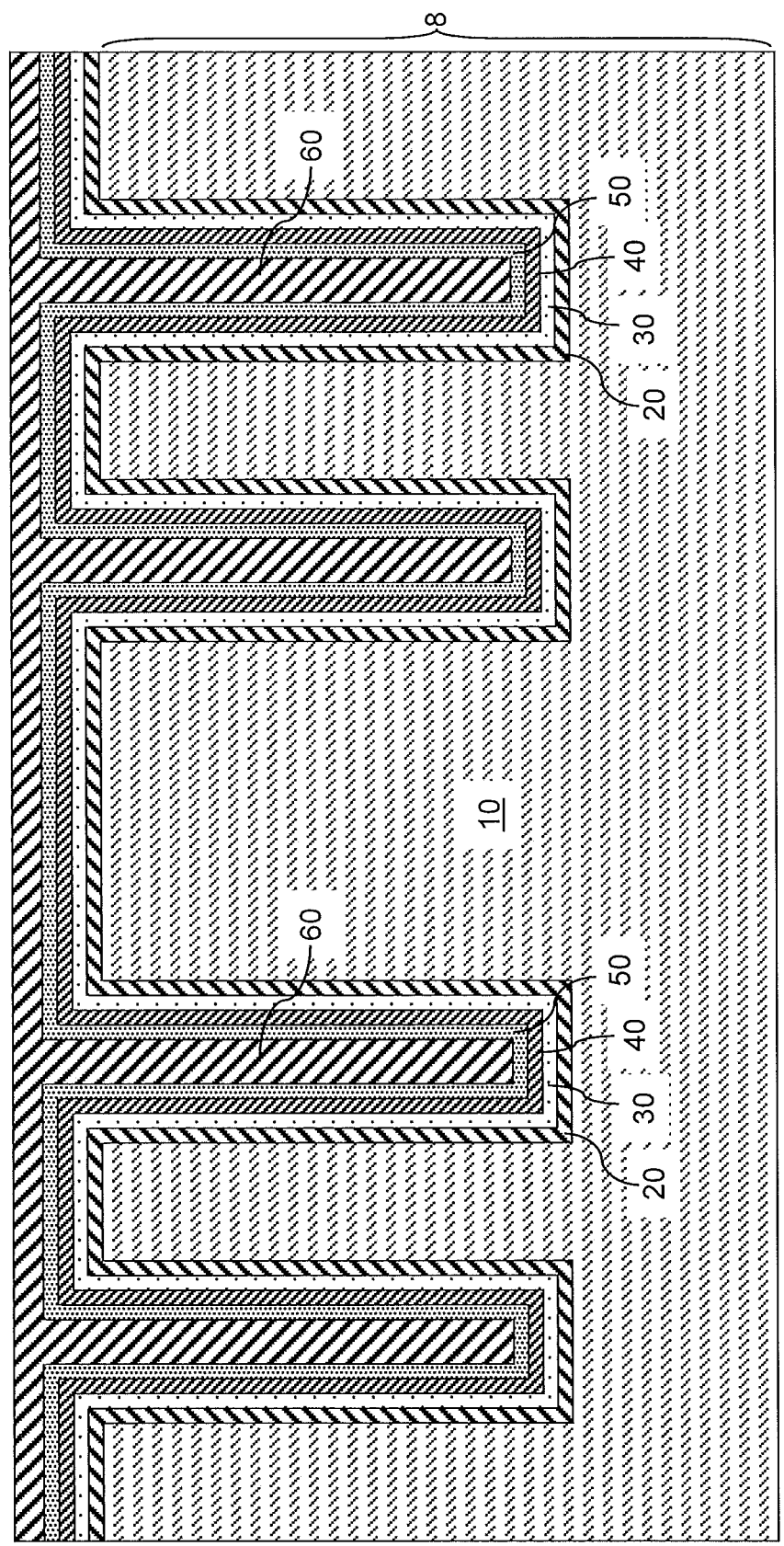

Referring to FIG. 2, a stack of material layers is deposited to fill the at least one deep trench 9. The stack of material layers includes, from bottom to top on a horizontal plane or from outside to inside within each of the at least one deep trench, a first conductive layer 20, a first node dielectric layer 30, a second conductive layer 40, a second node dielectric layer 50, and a third conductive layer 60. The first conductive layer 20 contiguously contacts a bottom surface and sidewalls of each of the at least one deep trench. The first node dielectric layer 30 contiguously contacts sidewalls of the first conductive layer 20. Further, the first node dielectric layer 30 contiguously contacts a top surface of any horizontal bottom portion of the first conductive layer 20 within a deep trench, if the deep trench is sufficiently wide at the bottom to form such a horizontal bottom portion. The second conductive layer 40 contiguously contacts sidewalls of the first node dielectric layer 30. Further, the second conductive layer 30 contiguously contacts a top surface of any horizontal bottom portion of the first node dielectric layer 30 within a deep trench, if the deep trench is sufficiently wide at the bottom to form such a horizontal bottom portion. The second node dielectric layer 50 contiguously contacts sidewalls of the second conductive layer 40. Further, the second node dielectric layer 50 contiguously contacts a top surface of any horizontal bottom portion of the second conductive layer 40 within a deep trench, if the deep trench is sufficiently wide at the bottom to form such a horizontal bottom portion. The third conductive layer 60 contiguously contacts sidewalls of the second node dielectric layer 50. Further, third conductive layer 60 contiguously contacts a top surface of any horizontal bottom portion of the second node dielectric layer 50 within a deep trench, if the deep trench is sufficiently wide at the bottom to form such a horizontal bottom portion.

The first conductive layer 20, the first node dielectric layer 30, the second conductive layer 40, the second node dielectric layer 50, and the third conductive layer 60 do not include any hole within the at least one deep trench. Thus, all surfaces of the first node dielectric layer 30 that are located within the at least one trench contact the first conductive layer 20 or the second conductive layer 40. Likewise, all surfaces of the second node dielectric layer 50 that are located within the at least one trench contact the second conductive layer 40 or the third conductive layer 60.

Each of the first node dielectric layer 30 and the second node dielectric layer 50 includes a dielectric material, which can be deposited by employing methods known in the art. For example, the dielectric materials of the first node dielectric layer 30 and the second node dielectric layer 50 can be deposited by chemical vapor deposition (CVD), atomic layer deposition (ALD), or a combination of thereof. Each of the first node dielectric layer 30 and the second node dielectric layer 50 can include silicon oxide, silicon nitride, a high-k material having a dielectric constant greater than the dielectric constant of silicon nitride, or any suitable combination of these materials. Exemplary high-k materials include a dielectric metal oxide or a dielectric metal oxide-nitride such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the first node dielectric layer 30 can be from 2 nm to 20 nm, and preferably from 3 nm to 10 nm, although lesser and greater thickness can also be employed Likewise, the thickness of the second node dielectric layer 50 can be from 2 nm to 20 nm, and preferably from 3 nm to 10 nm, although lesser and greater thickness can also be employed. Preferably, the thicknesses of the first node dielectric layer 30 and the second node dielectric layer 50 are set at a minimum value that does not increase a leakage current therethrough significantly.

Each of the first conductive layer 20, second conductive layer 40, and the third conductive layer 60 includes a conductive material. In the first embodiment, the conductive material of the second conductive layer 40 is selected to be different from the conductive material of the first conductive layer 20 and from the conductive material of the third conductive layer 60. Specifically, the conductive material of the second conductive layer 40 is selected such that an etch chemistry exists that etches the conductive material of the second conductive layer 40 selective to the conductive materials of the first and third conductive layers (20, 60) and at least another etch chemistry exists that etches the conductive materials of the first and/or third conductive layers (20, 60) selective to the conductive material of the second conductive layer 40. The conductive material of the first conductive layer 20 can be the same as, or can be different from, the conductive material of the third conducive material layer 50. Methods of depositing aluminum, an aluminum alloy, refractive metals, conductive nitrides of refractive metals, and doped semiconductor materials are known in the art, and include chemical vapor deposition (CVD), atomic layer deposition (ALD), and electroplating, electroless plating.

Etch chemistries are known in the art that etch aluminum selective to refractive metals, conductive nitrides of refractive metals, and doped semiconductor materials. Other etch chemistries are known in the art that etch refractive metals or conductive nitrides of refractive metals selective to aluminum and doped semiconductor materials. Yet other etch chemistries are known in the art that etch doped semiconductor materials selective to refractive metals, conductive nitrides of refractive metals, and aluminum. Preferably, etch chemistries that do not etch the dielectric materials of the first and second node dielectric layers (30, 50) are selected.

In one embodiment, the conductive material of the second conductive layer 40 is composed of aluminum or an aluminum alloy including at least 70% of aluminum in atomic composition, and the conductive materials of the first and third conductive layers (20, 40) include at least one refractory metal and/or at least one doped semiconductor material, which can be an elemental doped semiconductor material such as Si and Ge, a doped semiconductor alloy including Si and Ge, or a compound doped semiconductor material.

In another embodiment, the conductive material of the second conductive layer 40 is composed of at least one refractive metal and/or at least one conductive nitride of a refractive metal, and the conductive materials of the first and third conductive layers (20, 40) include aluminum and/or an aluminum alloy including at least 70% of aluminum in atomic composition and/or at least one doped semiconductor material, which can be a doped elemental semiconductor material such as doped Si and doped Ge, a doped semiconductor alloy including Si and Ge, or a doped compound semiconductor material.

In yet another embodiment, the conductive material of the second conductive layer 40 is composed of at least one doped semiconductor material, which can be a doped elemental semiconductor material such as doped Si and doped Ge, a doped semiconductor alloy including Si and Ge, or a doped compound semiconductor material, and the conductive materials of the first and third conductive layers (20, 40) include aluminum and/or an aluminum alloy including at least 70% of aluminum in atomic composition and/or at least one refractive metal and/or at least one conductive nitride of a refractive metal.

The thickness of the first conductive layer 20 can be from 3 nm to 50 nm, and typically from 5 nm to 20 nm, although lesser and greater thicknesses can also be employed The thickness of the second conductive layer 40 can be from 3 nm to 50 nm, and typically from 5 nm to 20 nm, although lesser and greater thicknesses can also be employed The thickness of the third conductive layer 60 can be selected to completely fill the at least one trench, and can be from 3 nm to 150 nm, and typically from 5 nm to 50 nm, although lesser and greater thicknesses can also be employed. The topmost surface of the third conductive layer 60 can be substantially planar if the at least one trench is completely filled by the combination of the first conductive layer 20, the first node dielectric layer 30, the second conductive layer 40, the second node dielectric layer 50, and the third conductive layer 60.

Figure 3:
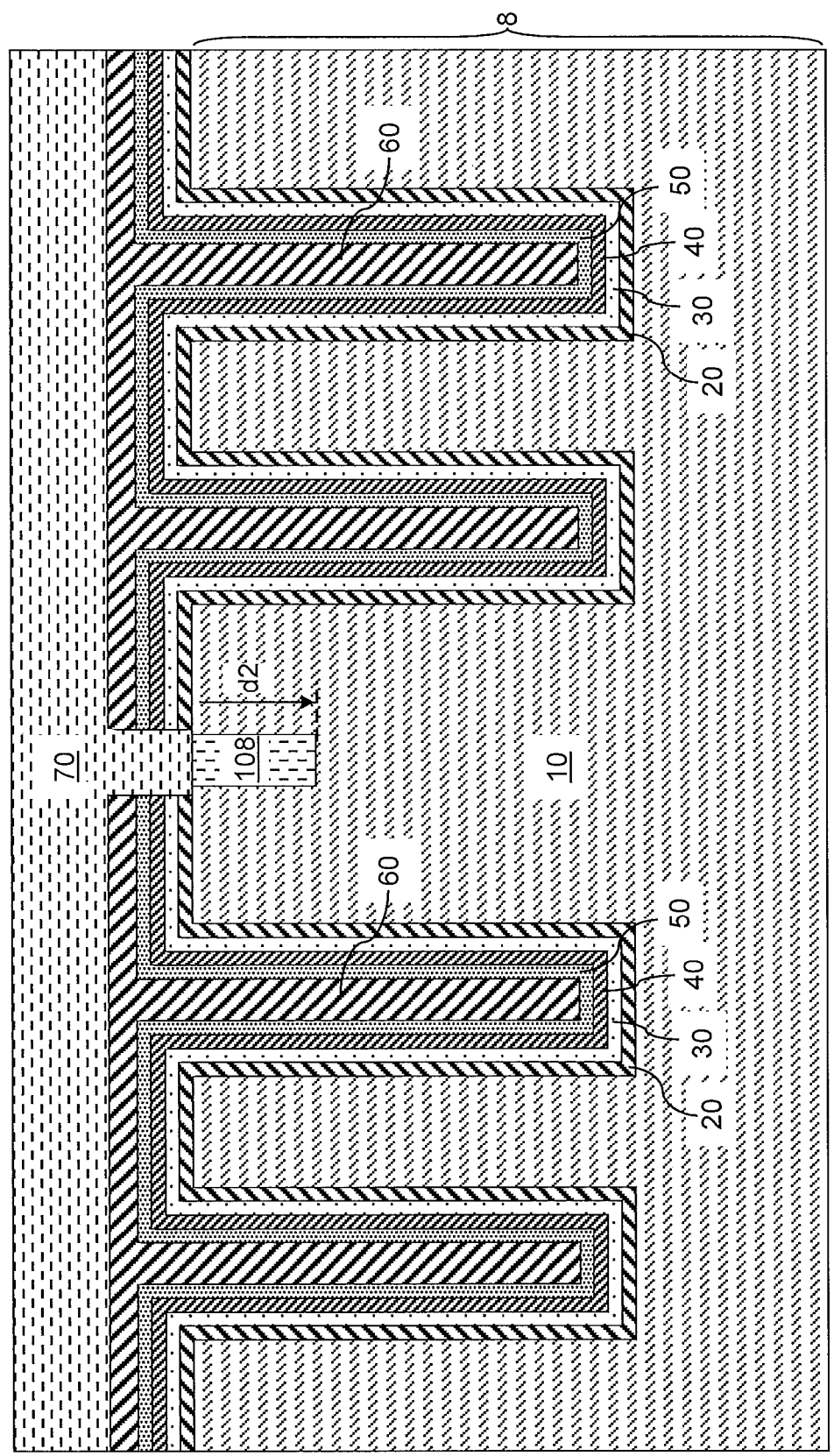

Referring to FIG. 3, the stack of the first conductive layer 20, the first node dielectric layer 30, the second conductive layer 40, the second node dielectric layer 50, and the third conductive layer 60 can be lithographically patterned, for example, by a combination of application and lithographic patterning of a photoresist layer (not shown), transfer of the pattern in the photoresist layer into the stack of the first conductive layer 20, the first node dielectric layer 30, the second conductive layer 40, the second node dielectric layer 50, and the third conductive layer 60, and subsequent removal of the photoresist layer selective to the third conductive layer 60. An anisotropic etch can be employed to transfer the pattern in the photoresist layer, which can form substantially vertical edge surfaces on each of the first conductive layer 20, the first node dielectric layer 30, the second conductive layer 40, the second node dielectric layer 50, and the third conductive layer 60. These substantially vertical edge surfaces are vertically coincident with one another, and are located above a top surface of the substrate.

At least one shallow trench isolation (STI) structure 108 can be optionally formed in the substrate material layer 10, for example, by forming a shallow trench by an anisotropic etch employing an etch mask (not shown) and by filling the shallow trench with a dielectric material such as silicon oxide, silicon nitride, or a combination thereof. The at least one STI structure 108 is embedded in the substrate material layer 10, which can be a semiconductor layer in some embodiments. If the substrate material layer 10 is a semiconductor layer, additional semiconductor devices (not shown), such as a field effect transistor or a bipolar transistor, can be formed on the top surface of the substrate material layer 10 employing methods known in the art.

Each of the at least one STI structure 108 extends from the top surface of the substrate material layer 10 to a second depth $d2$ into the substrate material layer 10. The first depth $d1$ (See FIG. 1) of the at least one trench is greater than the second depth $d2$. The second depth $d2$ is typically from 100 nm to 500 nm, and more typically from 200 nm to 400 nm, although lesser and greater thicknesses can also be employed.

A contact-level dielectric layer 70 is deposited over the stack of the first conductive layer 20, the first node dielectric layer 30, the second conductive layer 40, the second node dielectric layer 50, and the third conductive layer 60. The contact-level dielectric layer 70 includes a dielectric material such as undoped silicate glass (USG), doped silicate glass, porous or non-porous organosilicate glass (OSG), or any other dielectric material that can be employed to embed conductive contact via structures therein as known in the art. The top surface of the contact-level dielectric layer 70 can be substantially planar. The thickness of the contact-level dielectric layer 70 can be from 50 nm to 2,000 nm, and typically from 150 nm to 500 nm, although lesser and greater thicknesses can also be employed.

Figure 4:
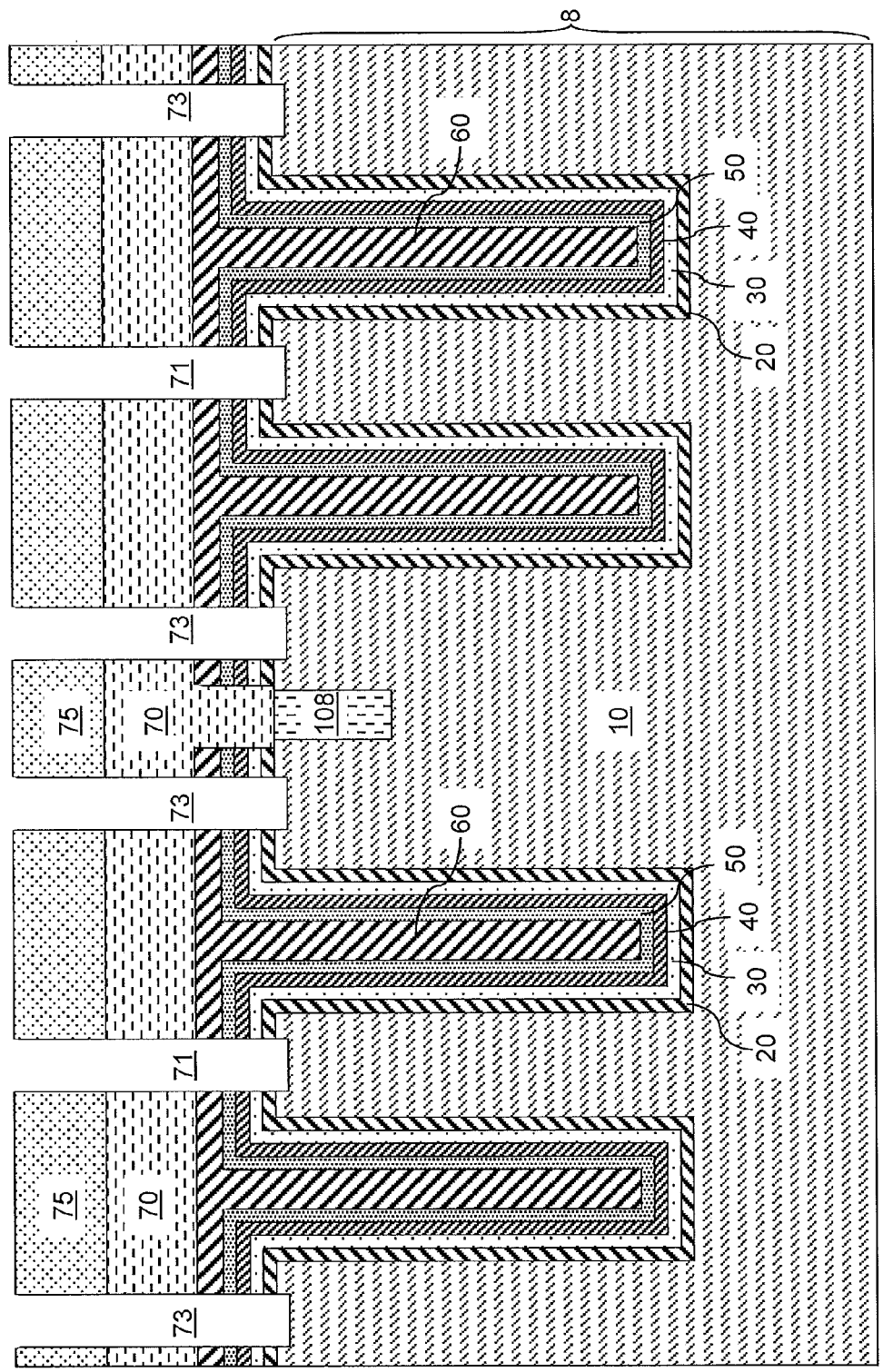

Referring to FIG. 4, a first photoresist layer 75 is applied to the top surface of the contact-level dielectric layer 70 and is lithographically patterned to form openings therein. The portions of the contact-level dielectric layer 70, the third conductive layer 60, the second node dielectric layer 50, the second conductive layer 40, the first node dielectric layer 30, and the first conductive layer 20 that underlie the openings are removed by an anisotropic etch that employs the first photoresist layer 75 as an etch mask to form at least one first-type via cavity 71 and at least one second-type via cavity 73. Each of the at least one first-type via cavity 71 and the at least one second-type via cavity 73 extends through horizontal portions of the first conductive layer 20, the first node dielectric layer 30, the second conductive layer 40, the second node dielectric layer 50, and the third conductive layer 60. Portions of the substrate semiconductor layer 10 can be recessed so that the at least one first-type via cavity 71 and the at least one second-type via cavity 73 extend underneath the topmost surface of the substrate material layer 10. In this case, a bottom surface of the at least one first-type via cavity 71 or the at least one second-type via cavity 73 can be recessed below the topmost surface of the substrate material layer 10. The lateral dimensions, e.g., a diameter, of the at least one first-type via cavity 71 or the at least one second-type via cavity 73 can be from 50 nm to 1,000 nm, and typically from 100 nm to 300 nm, although lesser and greater lateral dimensions can also be employed. The first photoresist layer 75 is subsequently removed.

Figure 5:
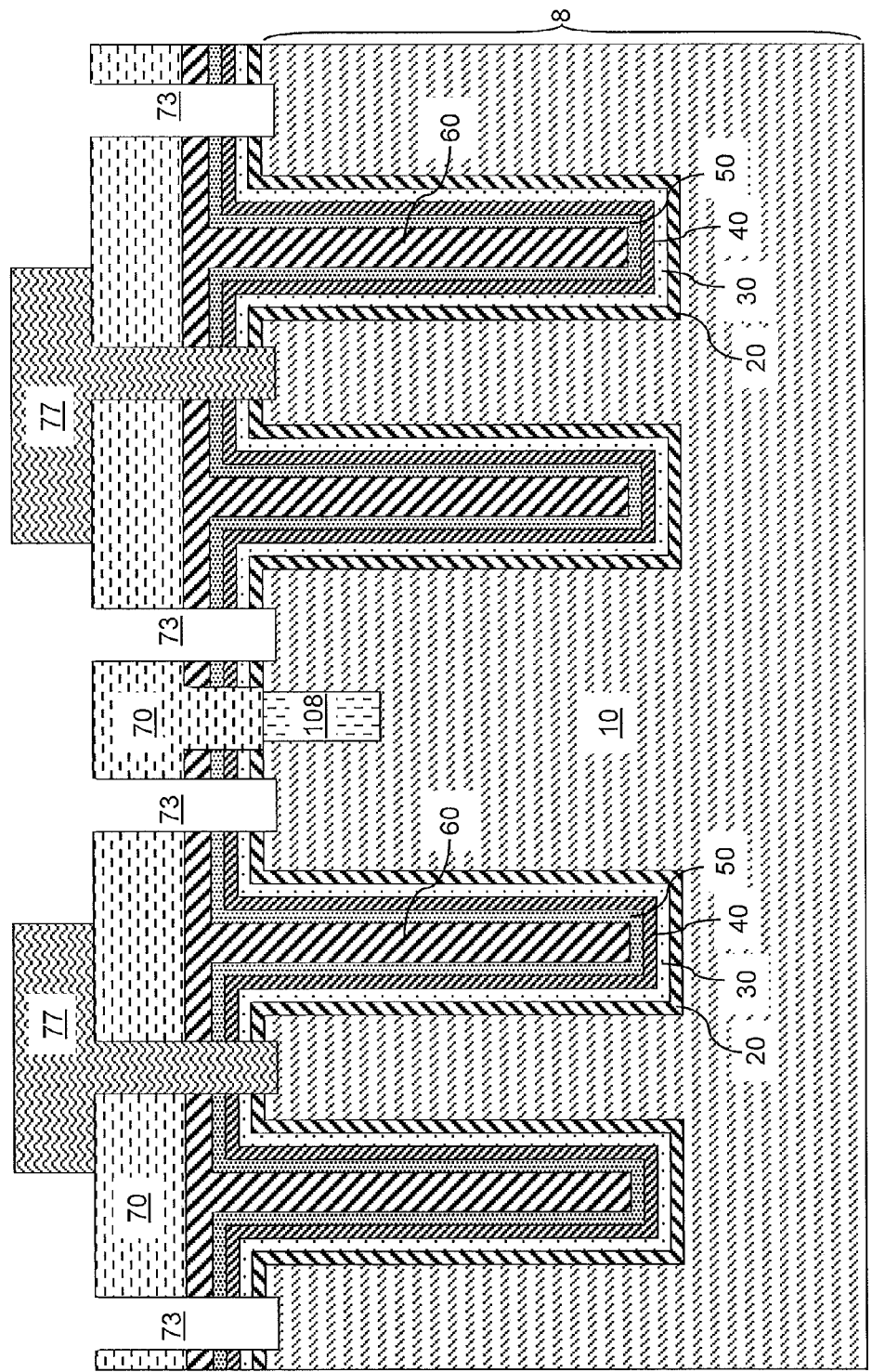

Referring to FIG. 5, a second photoresist layer 77 is applied to the top surface of the contact-level dielectric layer 70 and is lithographically patterned to cover the at least one first-type via cavity 71, while exposing the at least one second-type via cavity 73. The at least one first-type via cavity 71 is plugged by the second photoresist layer 77 so that etchants cannot reach the surfaces of the stack of the third conductive layer 60, the second node dielectric layer 50, the second conductive layer 40, the first node dielectric layer 30, and the first conductive layer 20 within the at least one first-type via cavity 71 in a subsequent etch step.

Figure 6:
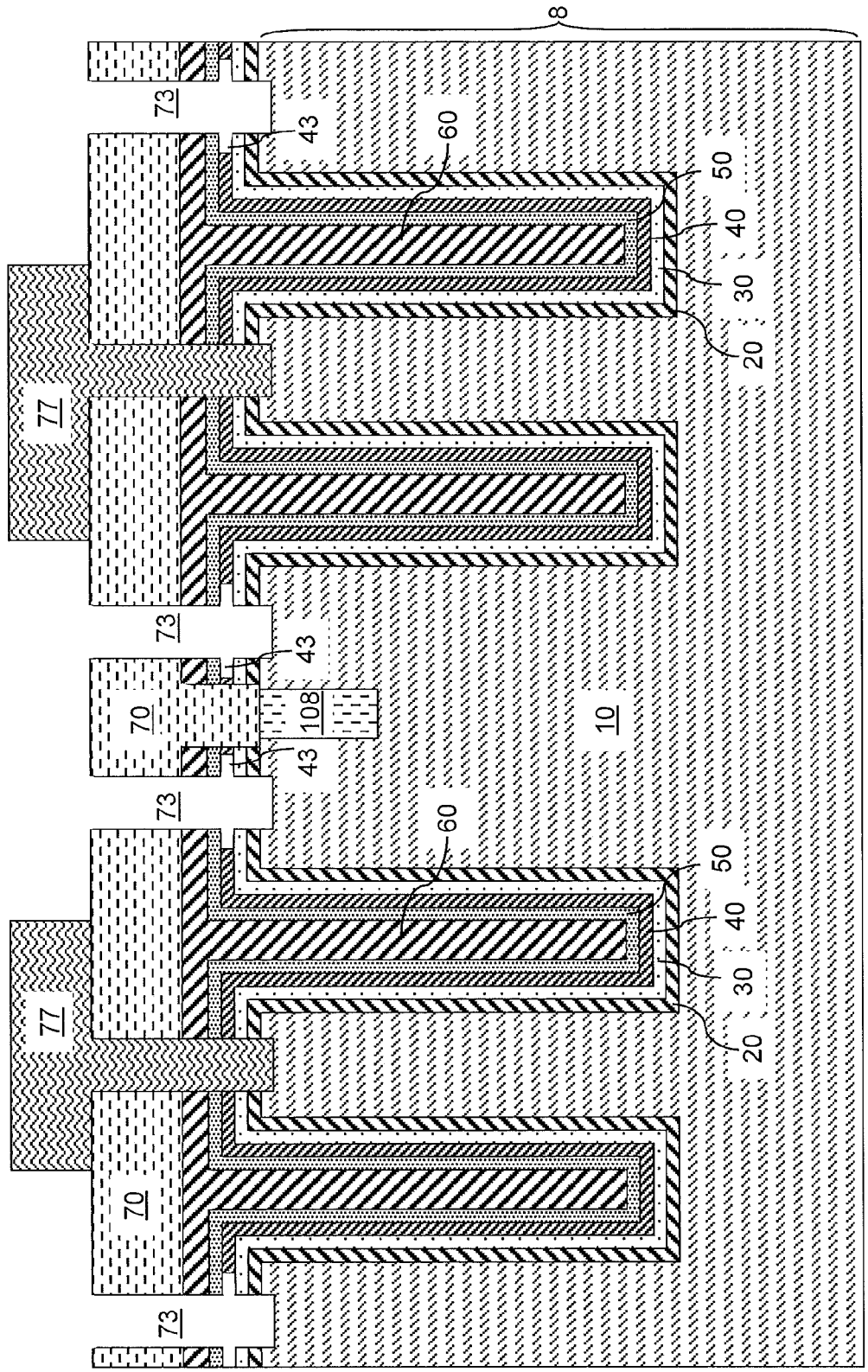

Referring to FIG. 6, a first etch is performed to etch the conductive material of the second conductive layer 40 selective to the conductive materials of the first and third conductive layers (20, 60) and the dielectric materials of the first and second node dielectric layers (30, 50) within the at least one second-type via cavity 73. The conductive material of the second conductive layer 40 is laterally removed selective to conductive materials of the first conductive layer 20 and the third conductive layer 60 by selecting for the first etch an etch chemistry that prevents any substantial etching of the conductive materials of the first and third conductive layers (20, 60) and the dielectric materials of the first and second node dielectric layers (30, 50). A second peripheral cavity 43 that is contiguous with a second-type via cavity 73 is formed in each laterally recessed portion of the second conductive layer 40. The lateral extent of the second peripheral cavity 43, i.e., the shortest horizontal distance between the unrecessed vertical surfaces of the first and second node dielectric layers (30, 50) and the recessed edge surfaces of the second conductive layer 40, can be from 2 nm to 50 nm, and typically from 5 nm to 20 nm, although lesser and greater lateral extents can also be employed. The first etch can be an isotropic etch such as a wet etch or an isotropic dry etch. The second photoresist layer 77 is subsequently removed.

Figure 7:
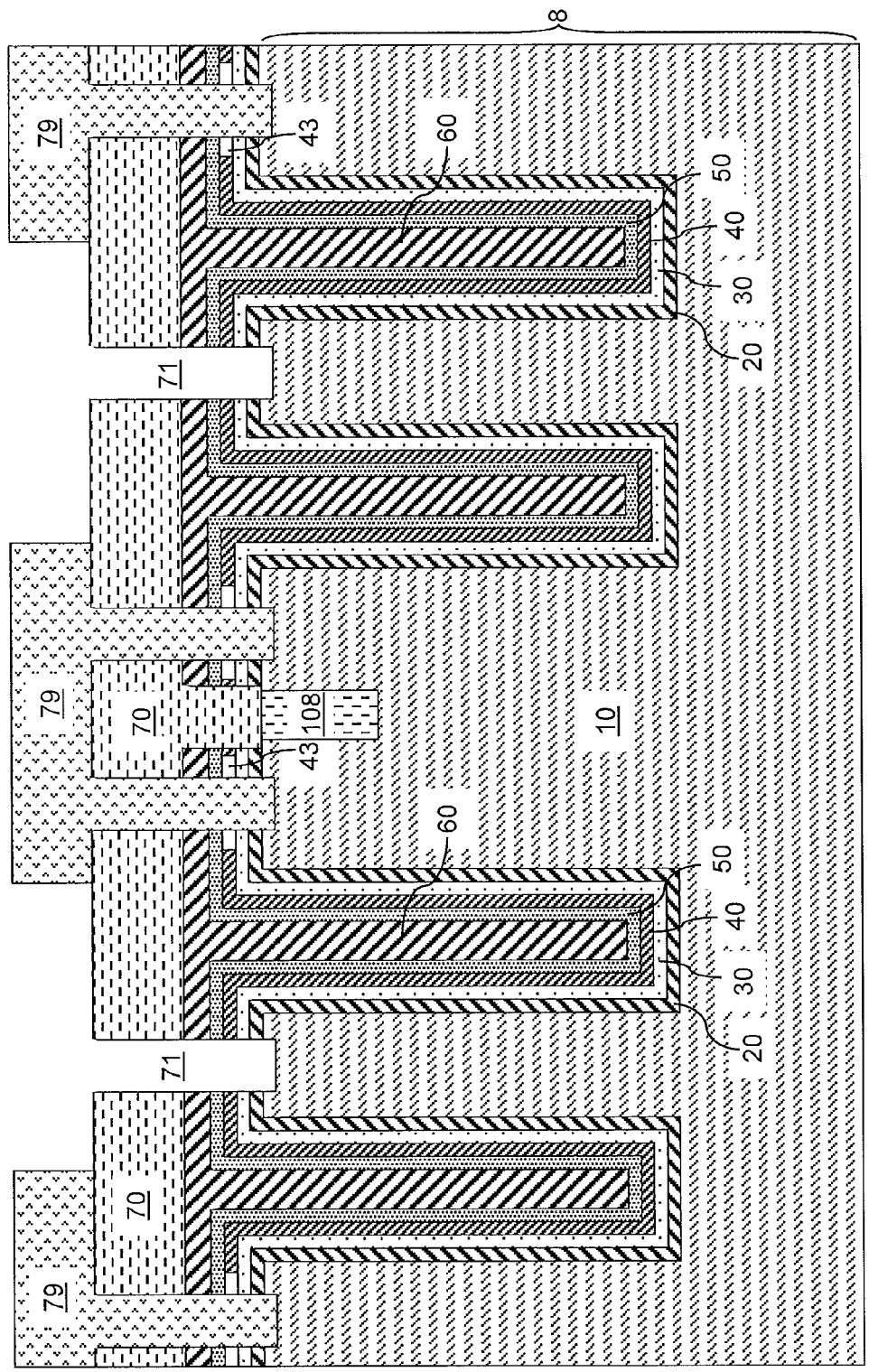

Referring to FIG. 7, a third photoresist layer 79 is applied to the top surface of the contact-level dielectric layer 70 and is lithographically patterned to cover the at least one second-type via cavity 73, while exposing the at least one first-type via cavity 71. The at least one second-type via cavity 73 is plugged by the third photoresist layer 79 so that etchants cannot reach the surfaces of the stack of the third conductive layer 60, the second node dielectric layer 50, the second conductive layer 40, the first node dielectric layer 30, and the first conductive layer 20 within the at least one second-type via cavity 73 in a subsequent etch step.

Figure 8:
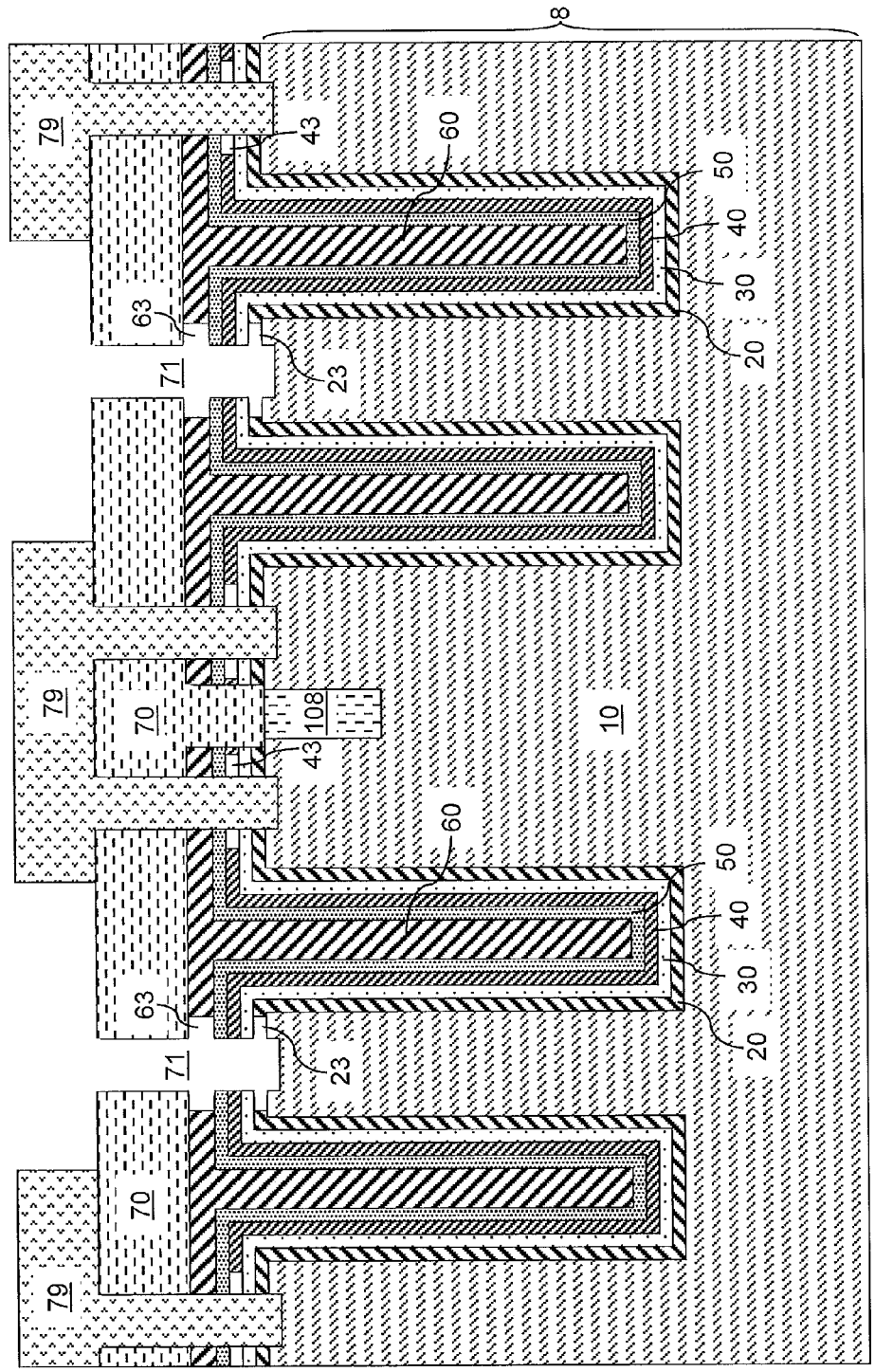

Referring to FIG. 8, a second etch is performed to etch the conductive material of the first and third conductive layer (20, 60) selective to the conductive material of the second conductive layer 40 and the dielectric materials of the first and second node dielectric layers (30, 50) within the at least one first-type via cavity 71. The conductive materials of the first and third conductive layers (20, 60) are laterally removed selective to conductive material of the second conductive layer 40 by selecting for the second etch an etch chemistry that prevents any substantial etching of the conductive materials of the second conductive layer 40 and the dielectric materials of the first and second node dielectric layers (30, 50). A first peripheral cavity 23 that is contiguous with a first-type via cavity 71 is formed in each laterally recessed portion of the first conductive layer 20. A third peripheral cavity 63 that is contiguous with a first-type via cavity 71 is formed in each laterally recessed portion of the third conductive layer 60. The lateral extent of the first peripheral cavity 23, i.e., the shortest horizontal distance between the unrecessed vertical surfaces of the first and second node dielectric layers (30, 50) and the recessed edge surfaces of the first conductive layer 20, can be from 2 nm to 50 nm, and typically from 5 nm to 20 nm, although lesser and greater lateral extents can also be employed. The lateral extent of the third peripheral cavity 63, i.e., the shortest horizontal distance between the unrecessed vertical surfaces of the first and second node dielectric layers (30, 50) and the recessed edge surfaces of the third conductive layer 60, can be from 2 nm to 50 nm, and typically from 5 nm to 20 nm, although lesser and greater lateral extents can also be employed. The second etch can be an isotropic etch such as a wet etch or an isotropic dry etch.

Figure 9:
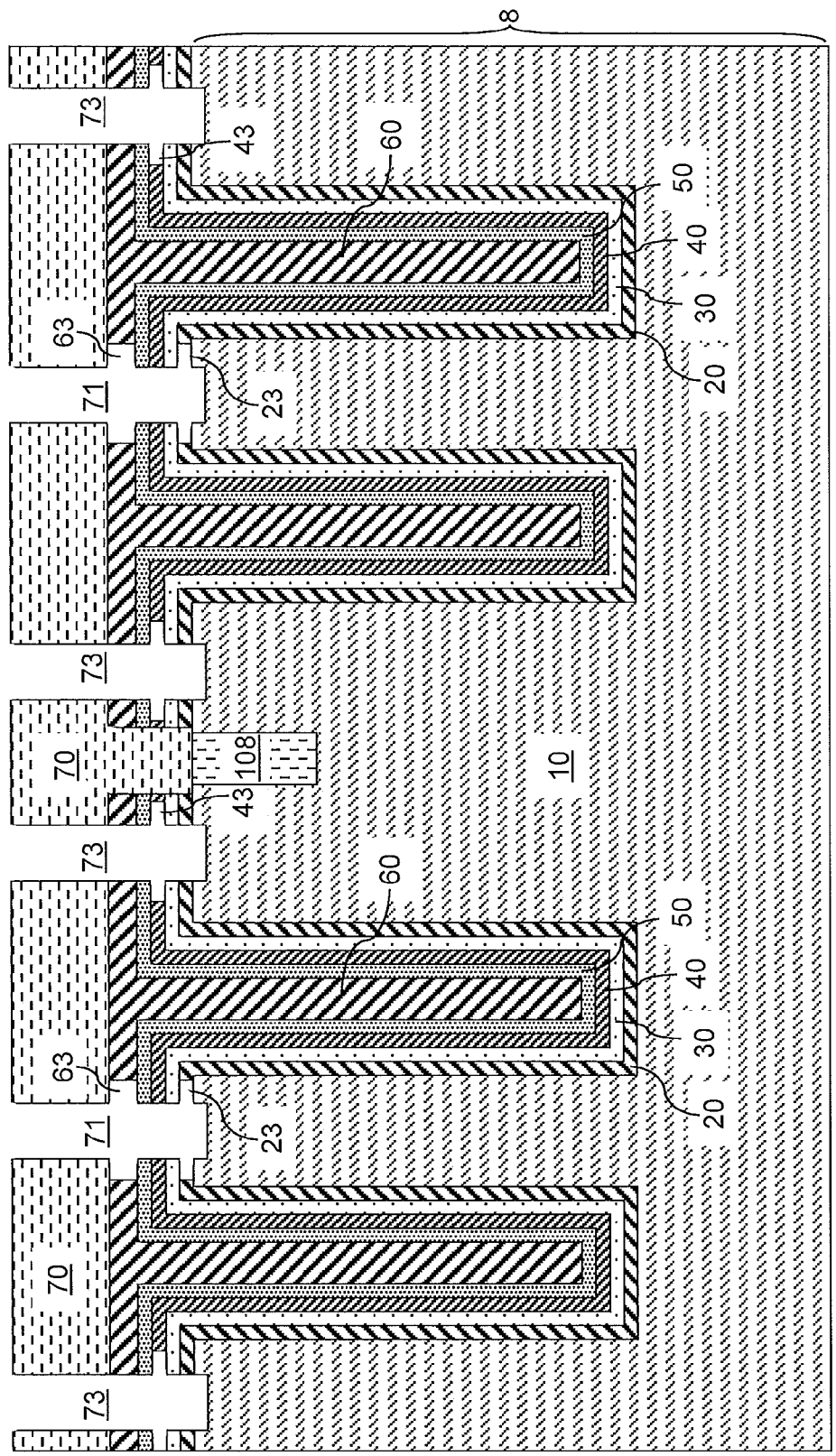

Referring to FIG. 9, the third photoresist layer 79 is subsequently removed.

Figure 10:
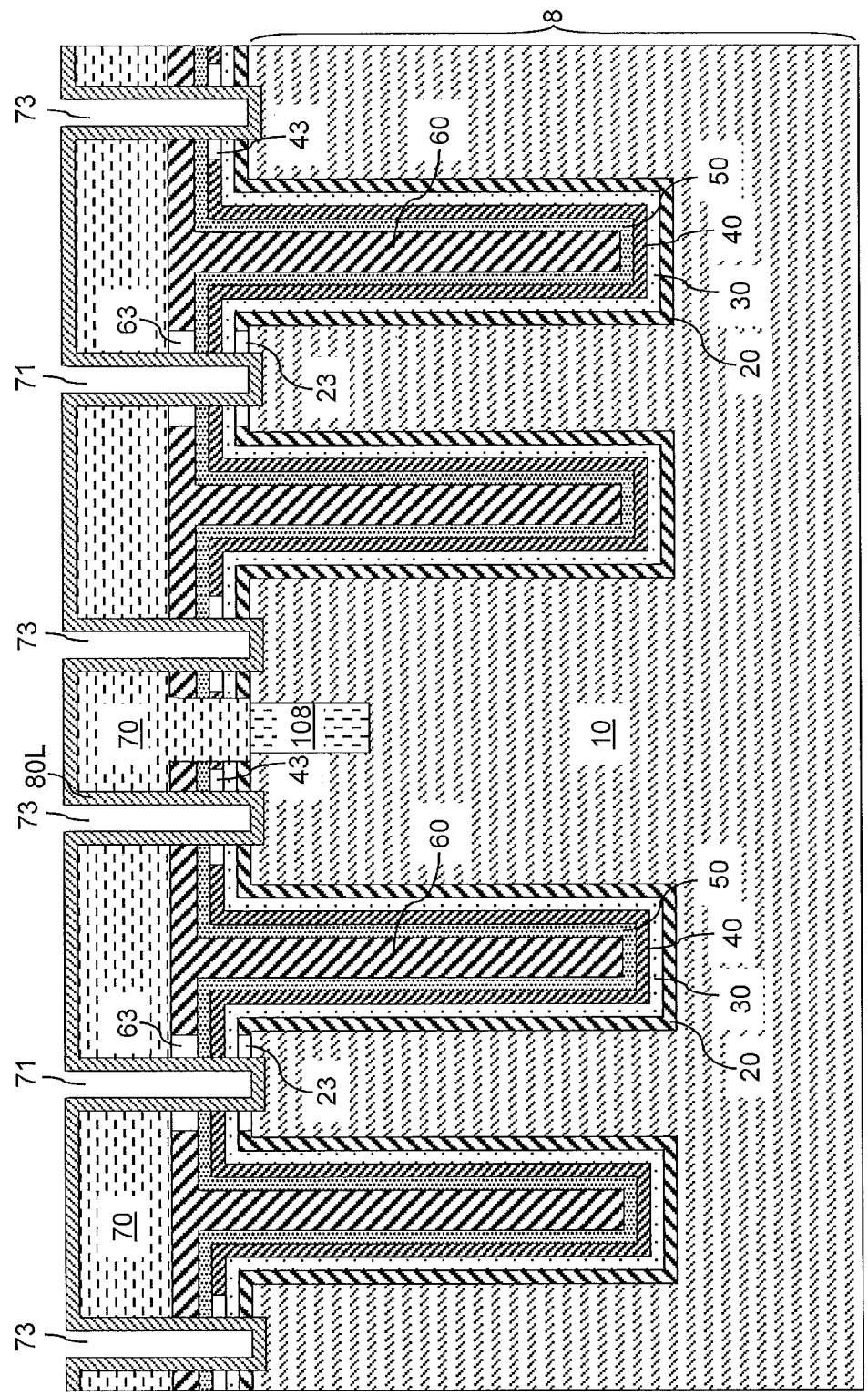

Referring to FIG. 10, a conductive liner layer 80L may be deposited. The conductive liner layer 80L includes a conductive material such as TiN, TaN, WN, Ti, Ta, W, or a combination thereof. The conductive liner layer 80L can be optional, i.e., may or may not be present. If present, the thickness of the conductive liner layer 80L can be from 2 nm to 30 nm, and typically from 3 nm to 10 nm, although lesser and greater thicknesses can also be employed. The conductive liner layer 80L is deposited in a non-conformal manner. Thus, the conductive liner layer 80L is not deposited within the at least one first peripheral cavity 23, the at least one second peripheral cavity 43, and the at least one third peripheral cavity 63. One exemplary method for depositing the conductive liner layer 80L in a non-conformal manner is physical vapor deposition (PVD, i.e., sputtering) and vacuum evaporation.

Figure 11:
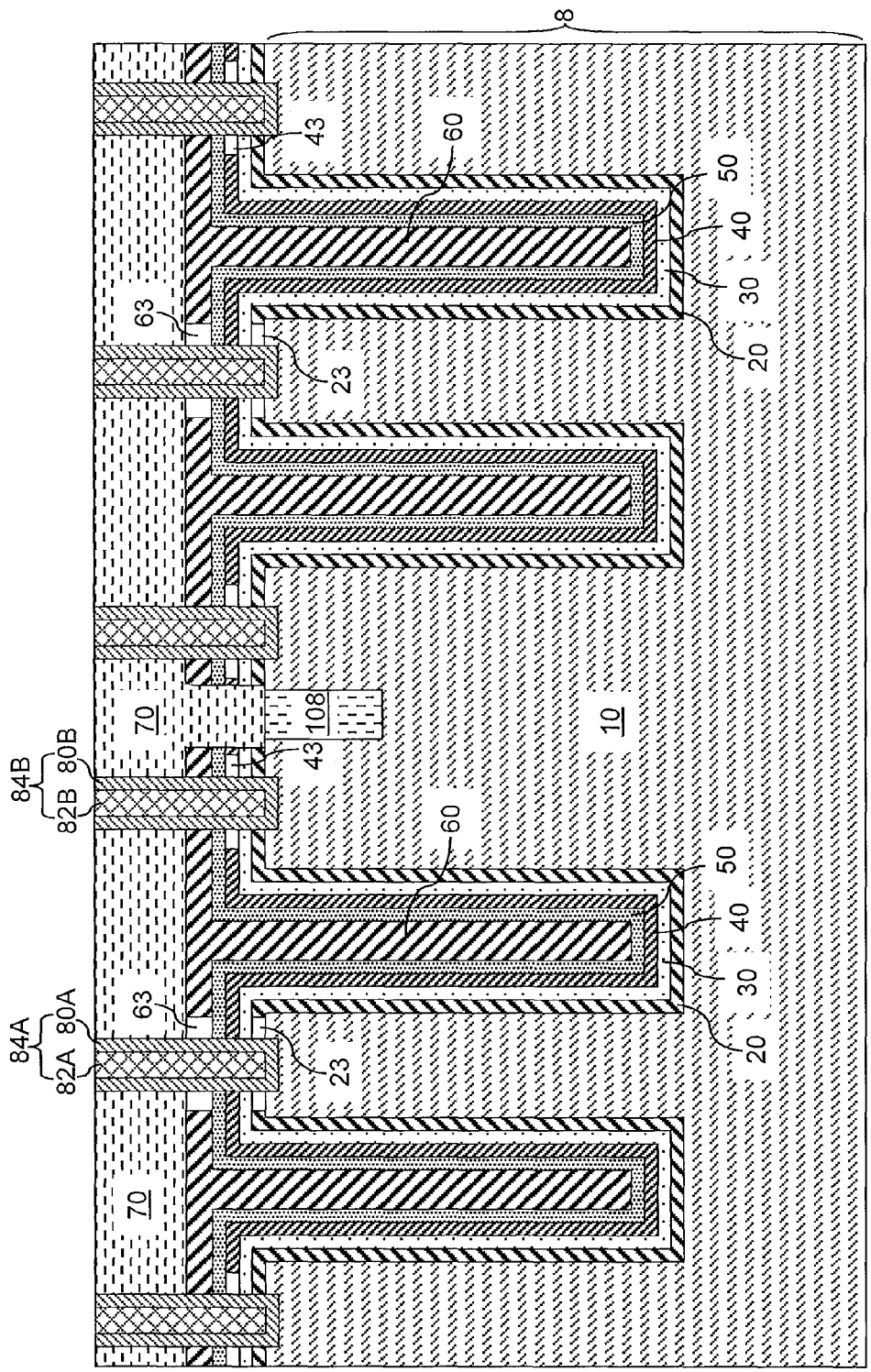

Referring to FIG. 11, a conductive fill material is deposited on the conductive liner layer 80L if the conductive liner layer 80L is present, or in the at least one first-type via cavity 71 and the at least one second-type via cavity if a conductive liner layer 80L is not present. In case the conductive liner layer 80L is present, the conductive fill material can be deposited employing a conformal or a non-conformal deposition method. In case a conductive liner layer 80L is not present, the conductive fill material is deposited employing a non-conformal deposition method such as physical vapor deposition. Exemplary methods of conformal deposition include chemical vapor deposition (PVD), electroless plating, and electroplating.

Excess conductive materials above the top surface of the contact-level dielectric layer 70 are removed, for example, by chemical mechanical planarization (CMP), a recess etch, or a combination thereof. The remaining portions of the conductive fill material and the conductive liner layer 80L, if any, that fills the at least one first-type via cavity 71 (See FIG. 10) constitute at least one first contact via structure 84A. The at least one first contact via structure 84A contacts the second conductive layer 40. Each of the at least one first contact via structure 84A is electrically isolated from the first conductive layer 20 due to a first peripheral cavity 23. Further, each of the at least one first contact via structure 84A is electrically isolated from the third conductive layer 60 due to a third peripheral cavity 63. Each first contact via structure 84A includes a first conductive fill portion 82A and may include a first conductive liner portion 80A, which is a remaining portion of the conductive liner layer 80L. Each first peripheral cavity 23 laterally surrounds a portion of a first conductive via structure 84A between a bottom surface of the first conductive layer 20 and a top surface of the first conductive layer 20. Each third peripheral cavity 63 laterally surrounds a portion of a first conductive via structure 84A between a bottom surface of the third conductive layer 60 and a top surface of the third conductive layer 60.

The remaining portions of the conductive fill material and the conductive liner layer 80L, if any, that fills the at least one second-type via cavity 73 (See FIG. 10) constitute at least one second contact via structure 84B. The at least one second contact via structure 84B contacts the first conductive layer 20 and the third conductive layer 60. Each of the at least one second contact via structure 84B is electrically isolated from the second conductive layer 40 due to a second peripheral cavity 43. Each second contact via structure 84B includes a second conductive fill portion 82B and may include a second conductive liner portion 80B, which is a remaining portion of the conductive liner layer 80L. Each second peripheral cavity 43 laterally surrounds a portion of a second conductive via structure 84B between a bottom surface of the second conductive layer 40 and a top surface of the second conductive layer 40.

The first conductive layer 20 and the third conductive layer 60 can subsequently be electrically connected by a metal interconnect structure (not shown) such as at least one metal line and/or at least one metal via in an interconnect-level dielectric layer (not shown). In this case, the first conductive layer 20 and the third conductive layer 60 collectively constitute one node of a capacitor structure, the second conductive layer 40 constitutes another node of the capacitor structure, and the first and second node dielectric layers (30, 50) collectively constitute a node dielectric of the capacitor structure. This capacitor structure effectively doubles the area of the capacitor compared with a prior art structure that employs at least one deep trench of a comparable size and number and a single layer of node dielectric.

Figure 12:
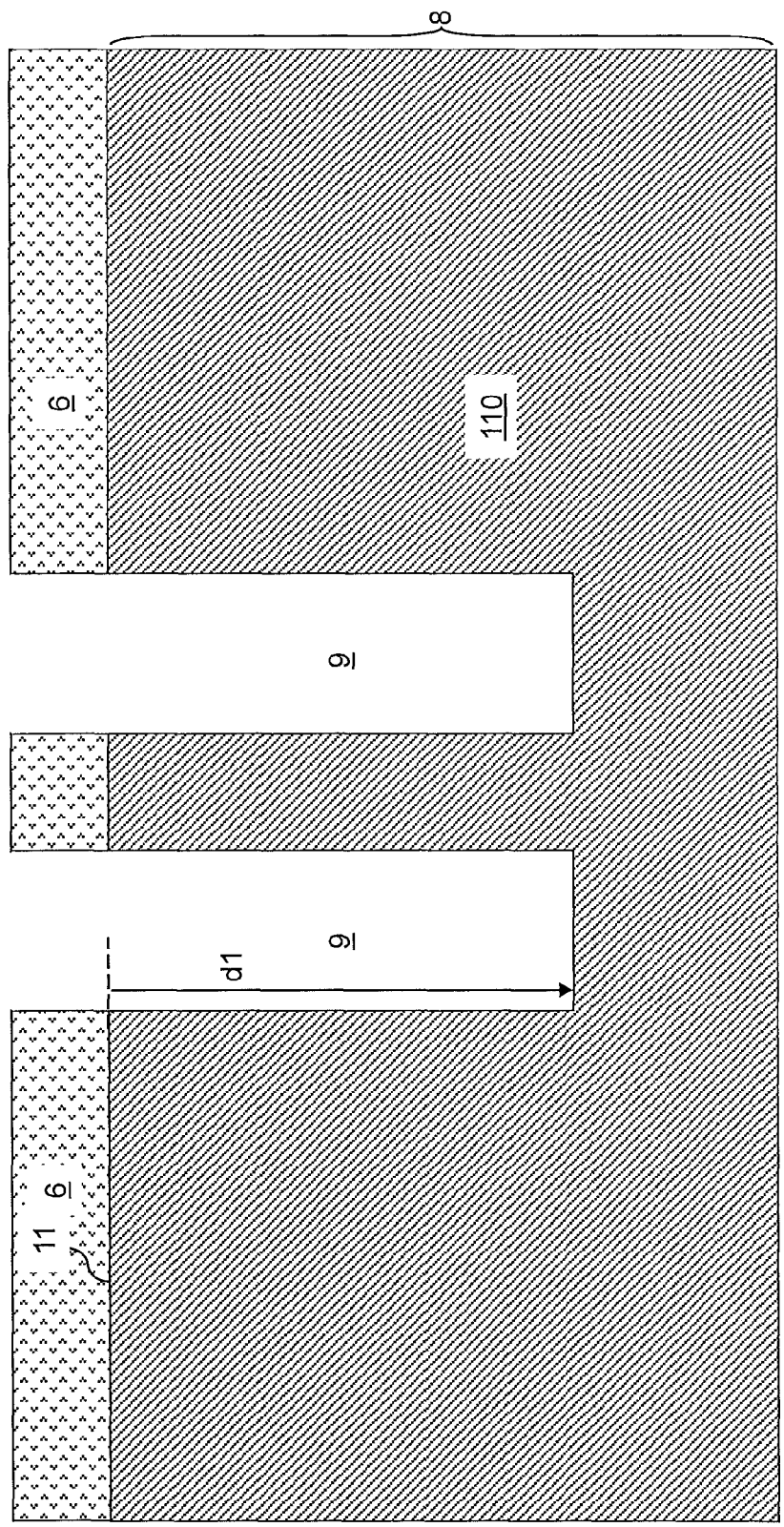
FIGS. 12-17 are sequential vertical cross-sectional views of a second exemplary structure according to a second embodiment of the present disclosure.

Referring to FIG. 12, a second exemplary structure according to a second embodiment of the present disclosure includes a substrate 8, a mask layer 6, and at least one deep trench 9. The substrate 8 includes at least a semiconductor material layer 110 that includes a semiconductor material having an electrical conductivity from $10^{-8}$ siemens per centimeter to $10^3$ siemens per centimeter, and preferably having an electrical conductivity from $10^{-8}$ siemens per centimeter to 10 siemens per centimeter. For example, if the semiconductor material layer 110 is a silicon layer, the semiconductor material layer 110 can be an intrinsic silicon layer having an electrical conductivity less than $10^{-2}$ siemens per centimeter. Alternately, the semiconductor material layer 110 can be a p-doped silicon layer or an n-doped silicon layer having a dopant concentration from about $10^{14}/cm^3$ to about $10^{20}/cm^3$ (corresponding to an electrical conductivity range from about $10^{-2}$ siemens per centimeter to $10^3$ siemens per centimeter), and preferably from about $10^{14}/cm^3$ to about $10^{17}/cm^3$ (corresponding to an electrical conductivity range from about $10^{-2}$ siemens per centimeter to 10 siemens per centimeter). Alternately, the semiconductor material layer 110 can include any other semiconductor material such as, but not limited to, germanium, a silicon-germanium alloy, a silicon-carbon alloy, a silicon-germanium-carbon alloy, gallium arsenide, indium arsenide, indium phosphide, III-V compound semiconductor materials, II-VI compound semiconductor materials, organic semiconductor materials, or other compound semiconductor materials. Further, in case the semiconductor material layer 110 is a semiconductor material layer 110, the semiconductor material layer 110 can be single crystalline, polycrystalline, amorphous, or have a combination of at least two of a single crystalline portion, a polycrystalline portion, and an amorphous portion. In an example, the substrate 8 can be a silicon substrate, in which case the semiconductor material layer 110 is a single crystalline silicon layer.

At least one deep trench 9 is formed in the semiconductor material layer 110. The at least one deep trench 9 can be formed by employing methods known in the art. Each of the at least one deep trench 9 has substantially vertical sidewalls and can have a substantially horizontal bottom surface. Typically, the substantially vertical sidewalls of the at least one deep trench 9 has a taper angle of less than 5 degrees, and preferably less than 2 degrees, and more preferably less than 1 degree. The taper angle is measured from a vertical line that is perpendicular to the top surface 11 of the substrate 8. The at least one deep trench 9 can be formed, for example, by employing the exemplary method described above in the first embodiment.

A first depth d1 of the at least one deep trench 9, as measured vertically from the top surface 11 of the substrate 8 to a bottom surface of the at least one deep trench 9, can be from 1 micron to 10 microns, and typically from 2 microns to 8 microns. Preferably, the electrical conductivity of the semiconductor material layer 110 is not increased above the level of the electrical conductivity of the semiconductor material layer 110 as originally provided. For example, maintaining the electrical conductivity of the semiconductor material layer 110 can be effected by not implanting any dopant into the semiconductor material layer 110. Any remaining portion of a photoresist (not shown), if any, and the mask layer 6 are subsequently removed selected to the material of the semiconductor material layer 110. If the semiconductor material layer 110 is a semiconductor layer, the at least one deep trench 9 is located in the semiconductor layer in the substrate 8.

Figure 13:
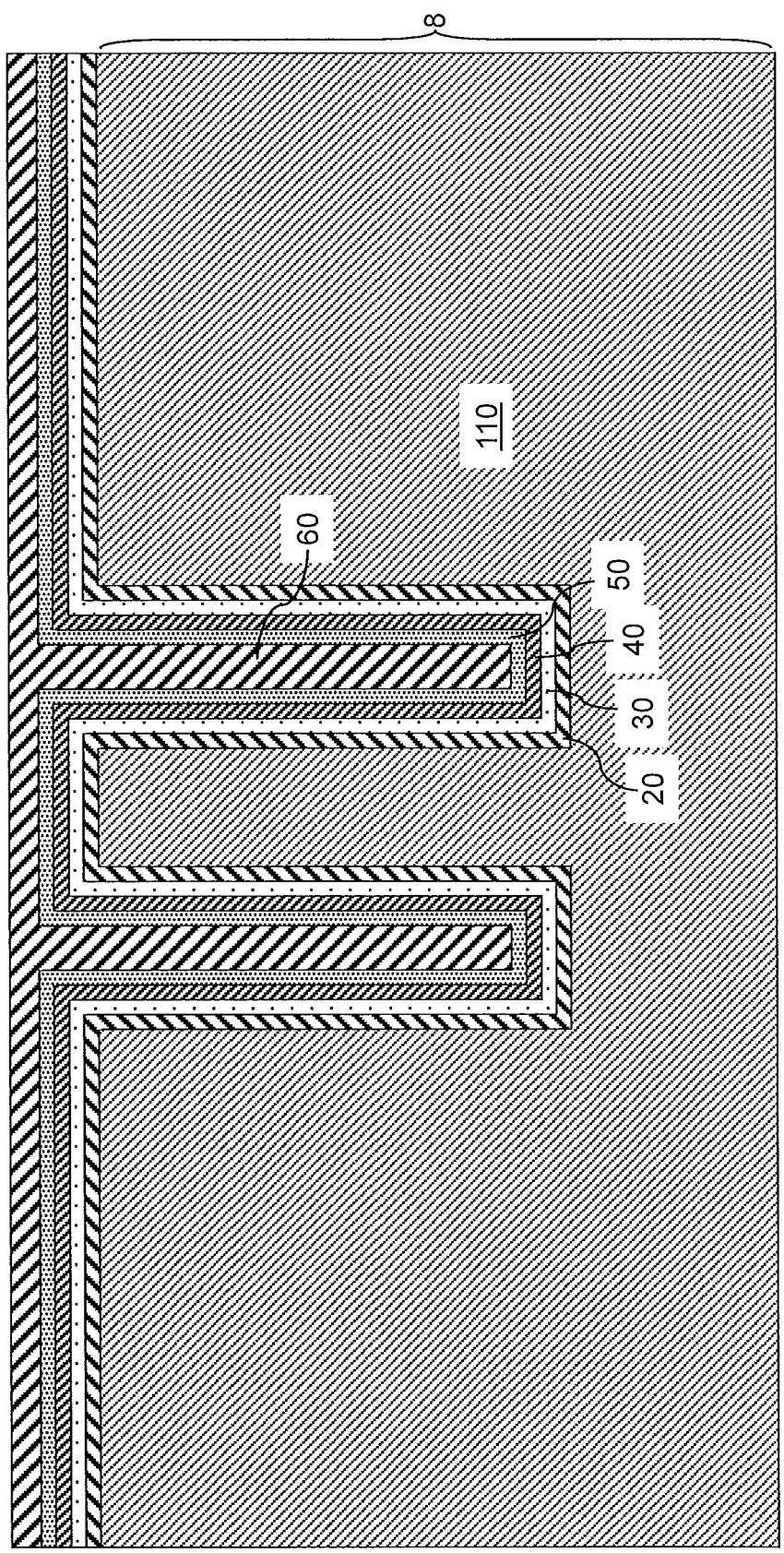

Referring to FIG. 13, a stack of material layers is deposited to fill the at least one deep trench 9. The stack of material layers includes, from bottom to top on a horizontal plane or from outside to inside within each of the at least one deep trench, a first conductive layer 20, a first node dielectric layer 30, a second conductive layer 40, a second node dielectric layer 50, and a third conductive layer 60. The first conductive layer 20 contiguously contacts a bottom surface and sidewalls of each of the at least one deep trench. The first node dielectric layer 30 contiguously contacts sidewalls of the first conductive layer 20. Further, the first node dielectric layer 30 contiguously contacts a top surface of any horizontal bottom portion of the first conductive layer 20 within a deep trench, if the deep trench is sufficiently wide at the bottom to form such a horizontal bottom portion. The second conductive layer 40 contiguously contacts sidewalls of the first node dielectric layer 30. Further, the second conductive layer 30 contiguously contacts a top surface of any horizontal bottom portion of the first node dielectric layer 30 within a deep trench, if the deep trench is sufficiently wide at the bottom to form such a horizontal bottom portion. The second node dielectric layer 50 contiguously contacts sidewalls of the second conductive layer 40. Further, the second node dielectric layer 50 contiguously contacts a top surface of any horizontal bottom portion of the second conductive layer 40 within a deep trench, if the deep trench is sufficiently wide at the bottom to form such a horizontal bottom portion. The third conductive layer 60 contiguously contacts sidewalls of the second node dielectric layer 50. Further, third conductive layer 60 contiguously contacts a top surface of any horizontal bottom portion of the second node dielectric layer 50 within a deep trench, if the deep trench is sufficiently wide at the bottom to form such a horizontal bottom portion.

The first conductive layer 20, the first node dielectric layer 30, the second conductive layer 40, the second node dielectric layer 50, and the third conductive layer 60 do not include any hole within the at least one deep trench. Thus, all surfaces of the first node dielectric layer 30 that are located within the at least one trench contact the first conductive layer 20 or the second conductive layer 40. Likewise, all surfaces of the second node dielectric layer 50 that are located within the at least one trench contact the second conductive layer 40 or the third conductive layer 60.

Each of the first node dielectric layer 30 and the second node dielectric layer 50 includes a dielectric material, which can have the same composition and thickness as in the first embodiment, and can be deposited employing the same method as in the first embodiment.

Each of the first conductive layer 20, second conductive layer 40, and the third conductive layer 60 includes a conductive material. Unlike the first embodiment, there is no limitation on the selection of the conductive materials of the first, second, and third conductive layers (20, 40, 60) in the second embodiment. In other words, consideration of the presence of any etch chemistry that selectively removed one conductive layer relative to another conductive layer is not necessary in the second embodiment. Thus, each of the first, second, and third conductive layers (20, 40, 60) in the second embodiment can include aluminum, an aluminum alloy, refractive metals, conductive nitrides of refractive metals, and doped semiconductor materials, which can be an elemental doped semiconductor material such as Si and Ge, a doped semiconductor alloy including Si and Ge, or a compound doped semiconductor material. The conductive material of any of the first, second, and third conductive layers (20, 40, 60) can be the same as, or can be different from, the conductive materials of the other two of the first, second, and third conductive layers (20, 40, 60). Methods of depositing aluminum, an aluminum alloy, refractory metals, conductive nitrides of refractory metals, and doped semiconductor materials are known in the art, and include chemical vapor deposition (CVD), atomic layer deposition (ALD), and electroplating, electroless plating.

The thickness of the first conductive layer 20 can be from 3 nm to 50 nm, and typically from 5 nm to 20 nm, although lesser and greater thicknesses can also be employed The thickness of the second conductive layer 40 can be from 3 nm to 50 nm, and typically from 5 nm to 20 nm, although lesser and greater thicknesses can also be employed The thickness of the third conductive layer 60 can be selected to completely fill the at least one trench, and can be from 3 nm to 150 nm, and typically from 5 nm to 50 nm, although lesser and greater thicknesses can also be employed. The topmost surface of the third conductive layer 60 can be substantially planar if the at least one trench is completely filled by the combination of the first conductive layer 20, the first node dielectric layer 30, the second conductive layer 40, the second node dielectric layer 50, and the third conductive layer 60.

Figure 14:
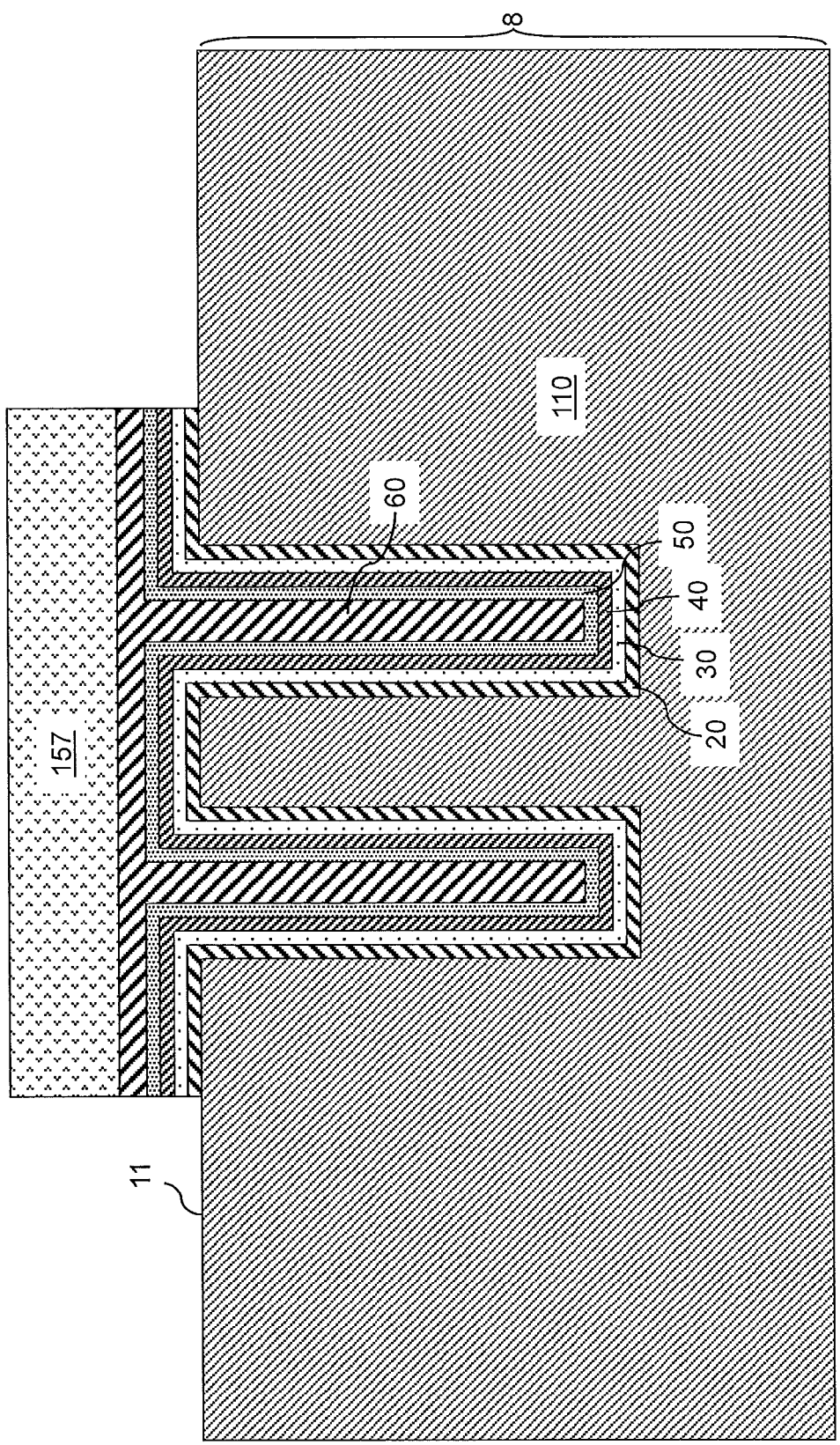

Referring to FIG. 14, a first photoresist layer 157 is applied to the top surface of the third conductive layer 60. An anisotropic etch is employed to pattern the stack of the third conductive layer 60, the second node dielectric layer 50, the second conductive layer 40, the first node dielectric layer 30, and the first conductive layer 20. Substantially vertical edge surfaces are formed on each of the third conductive layer 60, the second node dielectric layer 50, the second conductive layer 40, the first node dielectric layer 30, and the first conductive layer 20. These substantially vertical edge surfaces are vertically coincident with one another, i.e., coincide with one another in a top-down view taken along a direction perpendicular to the top surface 11 of the substrate 8. All of the substantially vertical edge surfaces are located above the top surface 11 of the substrate 8.

Figure 15:
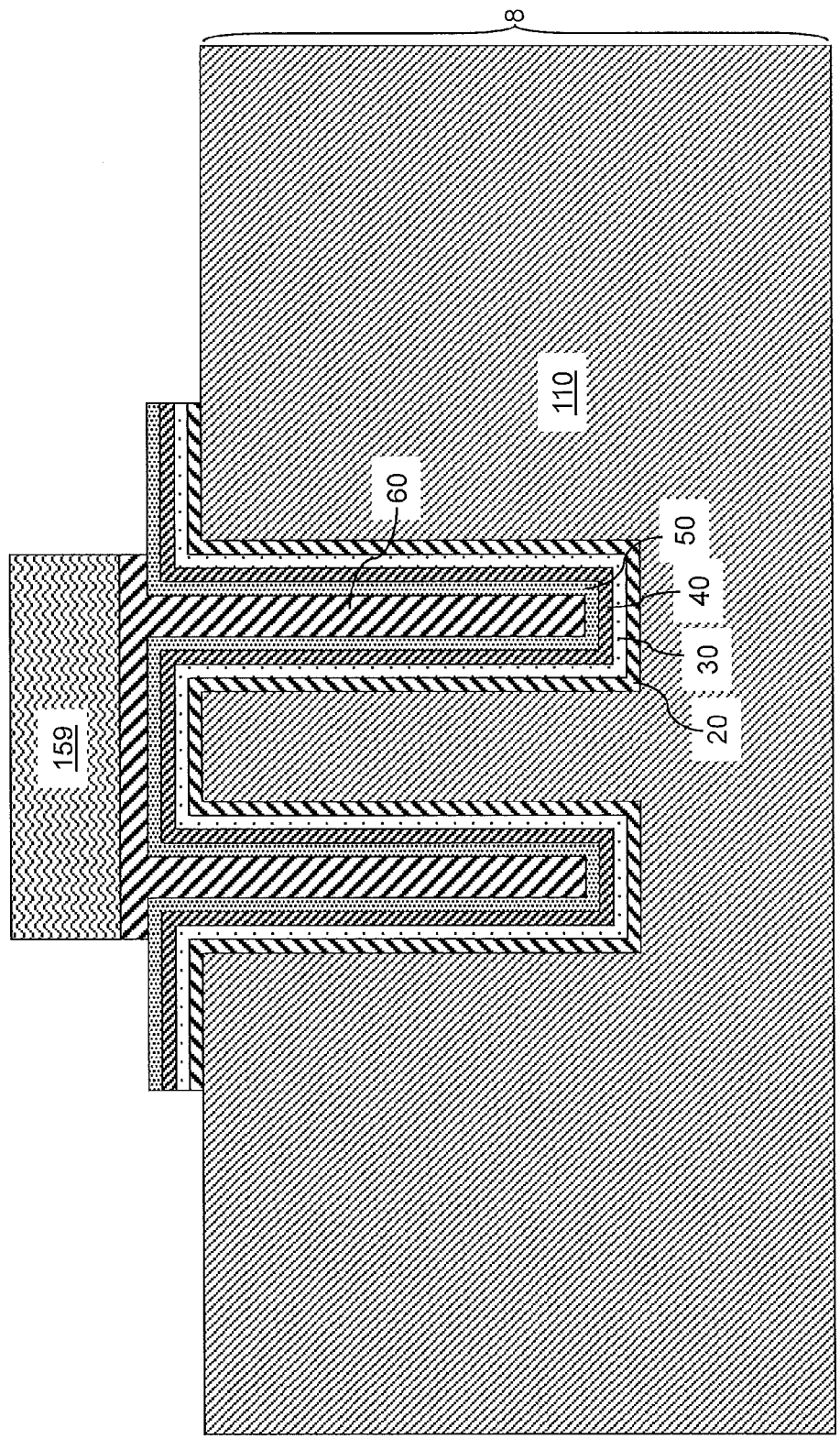

Referring to FIG. 15, a second photoresist layer 159 is applied to the top surface of the third conductive layer 60. An etch is employed to pattern the third conductive layer 60. Preferably, the etch stops on the second node dielectric layer 50. The etch can be selective to the semiconductor material of the semiconductor material layer 110 and the dielectric material of the second node dielectric layer 50. The etch can be an isotropic etch such as a wet etch, or can be an anisotropic etch such as a reactive ion etch. After the patterning of the third conductive layer 60, edge surfaces of the third conductive layer 60 overlies the top surface of the second node dielectric layer 50.

Figure 16:
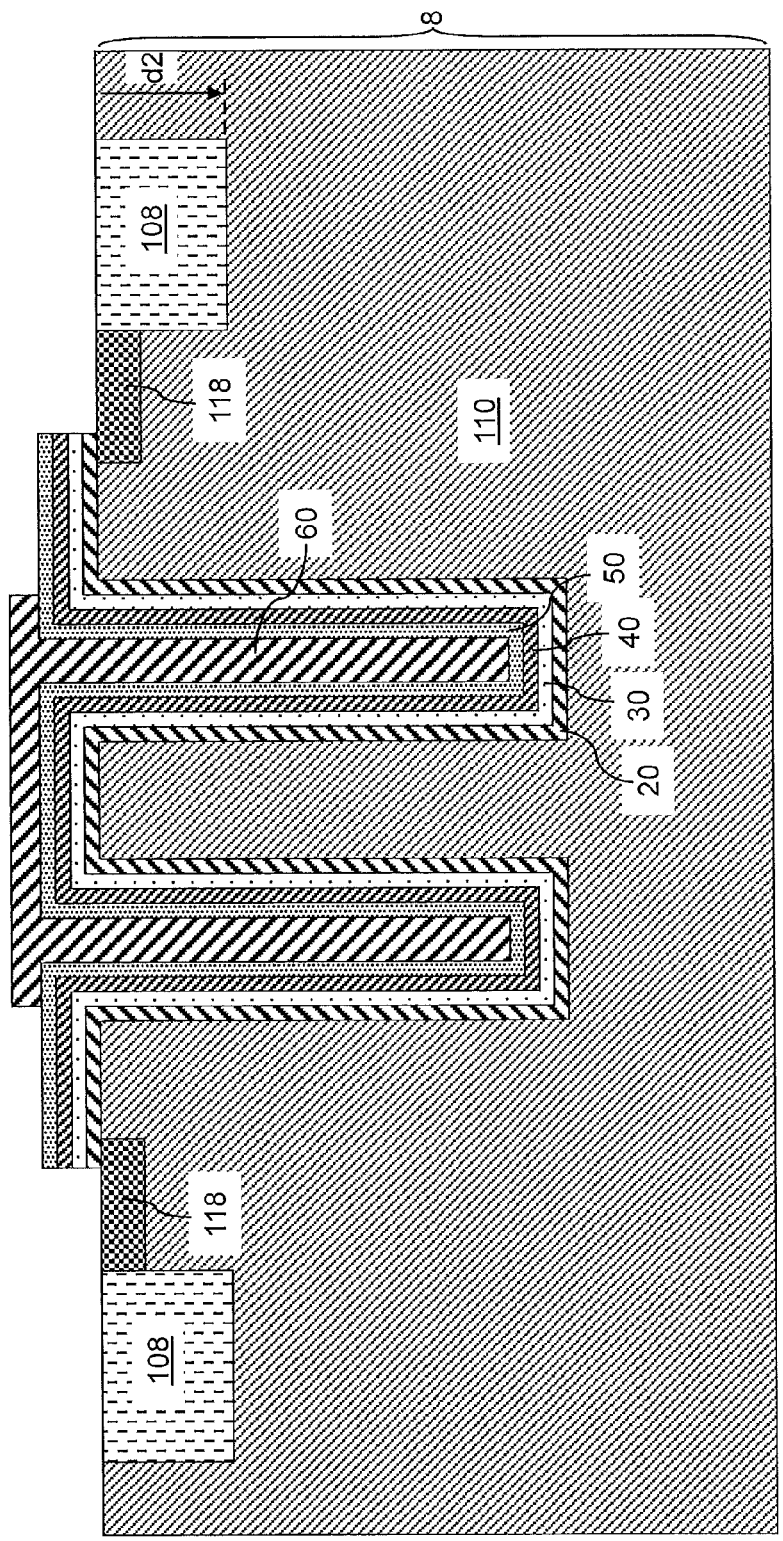

Referring to FIG. 16, at least one shallow trench isolation (STI) structure 108 can be optionally formed in the semiconductor material layer 110, for example, by forming a shallow trench by an anisotropic etch employing an etch mask (not shown) and by filling the shallow trench with a dielectric material such as silicon oxide, silicon nitride, or a combination thereof. The at least one STI structure 108 is embedded in the semiconductor material layer 110, which can be a semiconductor layer in some embodiments. Additional semiconductor devices (not shown), such as a field effect transistor or a bipolar transistor, can be formed on the top surface of the semiconductor material layer 110 employing methods known in the art.

Each of the at least one STI structure 108 extends from the top surface of the substrate material layer 10 to a second depth d2 into the semiconductor material layer 110. The first depth d1 (See FIG. 12) of the at least one trench is greater than the second depth d2. The second depth d2 is typically from 100 nm to 500 nm, and more typically from 200 nm to 400 nm, although lesser and greater thicknesses can also be employed.

At least one metal-semiconductor-alloy region 118 is formed at portions of the top surface of the semiconductor material layer 110. The at least one metal-semiconductor-alloy region 118 can be formed by depositing a metal layer on at least one area of the top surface of the semiconductor material layer 110, and inducing a reaction between the metal layer and the semiconductor material underneath. In case the semiconductor material layer 110 includes silicon, the metal-semiconductor-alloy region 118 can include a metal silicide. In case the semiconductor material layer 110 includes germanium, the metal-semiconductor-alloy region 118 can include a metal germanide. The at least one metal-semiconductor-alloy region 118 is located in the substrate 8 and contacting a peripheral bottom surface of the first conductive layer 20.

The area on which the at least one metal-semiconductor-alloy region 118 is formed can be defined by employing a patterned dielectric mask layer (not shown), which can be removed after forming the at least one metal-semiconductor-alloy region 118. The at least one metal-semiconductor-alloy region 118 contacts a peripheral bottom surface of the first conductive layer 20, and can be laterally limited by the at least one STI structure 108. Electrical dopants (e.g., p-type dopants or n-type dopants) can be implanted near the area of contact between the second conductive layer 20 and the at least one metal-semiconductor-alloy region 118 to reduce the electrical resistance between the at least one metal-semiconductor-alloy region 118 and the first conductive layer 20.

Figure 17:
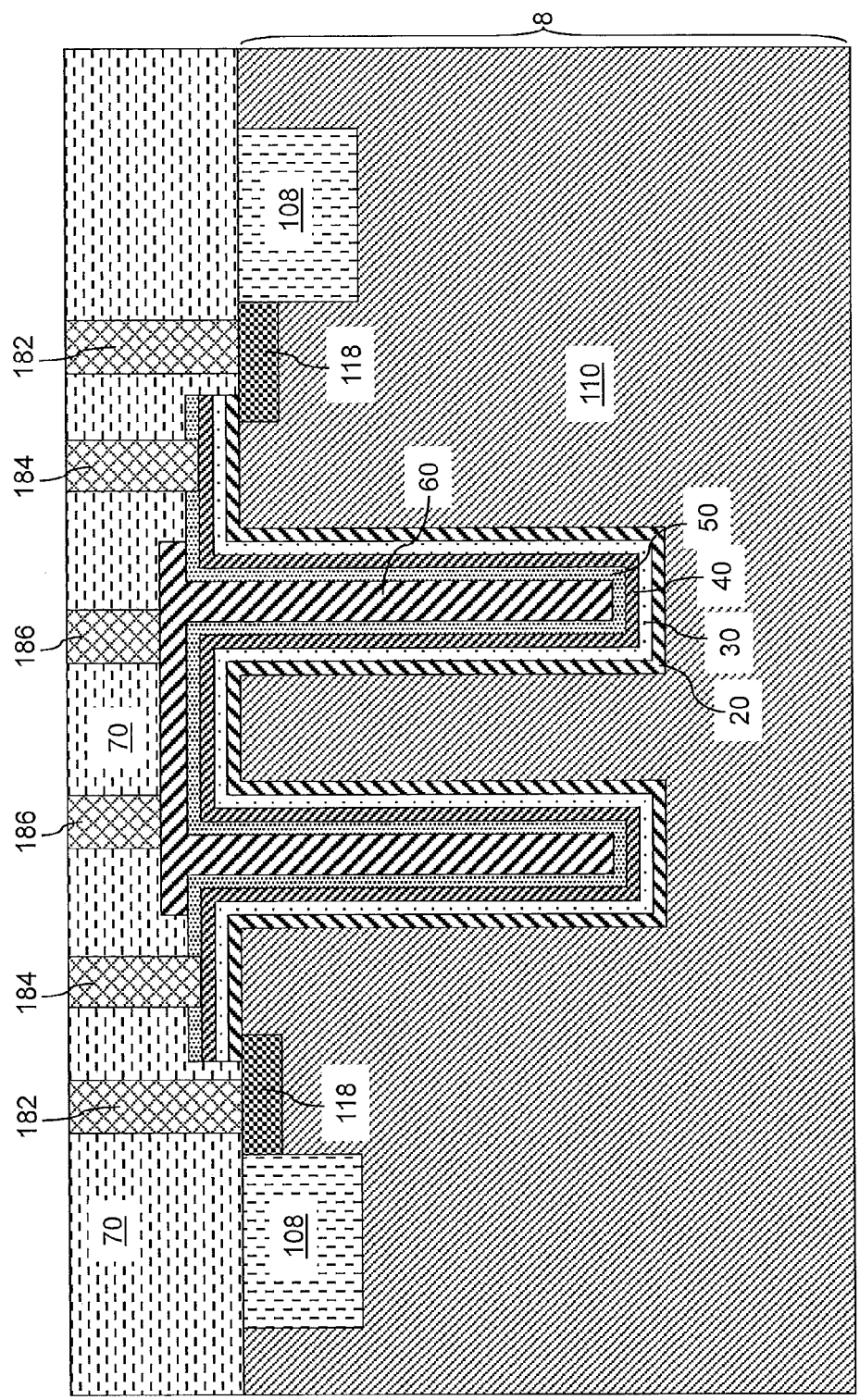

Referring to FIG. 17, a contact-level dielectric layer 70 is deposited over the stack of the first conductive layer 20, the first node dielectric layer 30, the second conductive layer 40, the second node dielectric layer 50, and the third conductive layer 60. The contact-level dielectric layer 70 can have the same composition and thickness as in the first embodiment, and can be formed employing the same method as in the first embodiment.

Various via cavities are formed in the contact-level dielectric layer 70, for example, by applying and lithographically patterning a photoresist layer to form openings therein and by transferring the pattern of openings in the photoresist layer into the contact-level dielectric layer 70 by an anisotropic etch. The anisotropic etch can employ a chemistry that stops on a metallic material such as the conductive material of the third conductive layer 60, the conductive material of the second conductive layer 40, and the metal-semiconductor-alloy in the at least one metal-semiconductor-alloy region 118, while etching through the dielectric material of the contact-level dielectric layer 70 and the second node dielectric layer 50. At least one first contact via structure 182 contacting the at least one metal-semiconductor-alloy region 118, at least one second contact via structure 184 contacting the second conductive layer 40, and at least one third contact via structure 186 contacting the third conductive layer 60 are formed by filling the various via cavities.

The first conductive layer 20 and the third conductive layer 60 can subsequently be electrically connected by a metal interconnect structure (not shown) such as at least one metal line and/or at least one metal via in an interconnect-level dielectric layer (not shown). In this case, the first conductive layer 20 and the third conductive layer 60 collectively constitute one node of a capacitor structure, the second conductive layer 40 constitutes another node of the capacitor structure, and the first and second node dielectric layers (30, 50) collectively constitute a node dielectric of the capacitor structure. This capacitor structure effectively doubles the area of the capacitor compared with a prior art structure that employs at least one deep trench of a comparable size and number and a single layer of a node dielectric.

Figure 18:
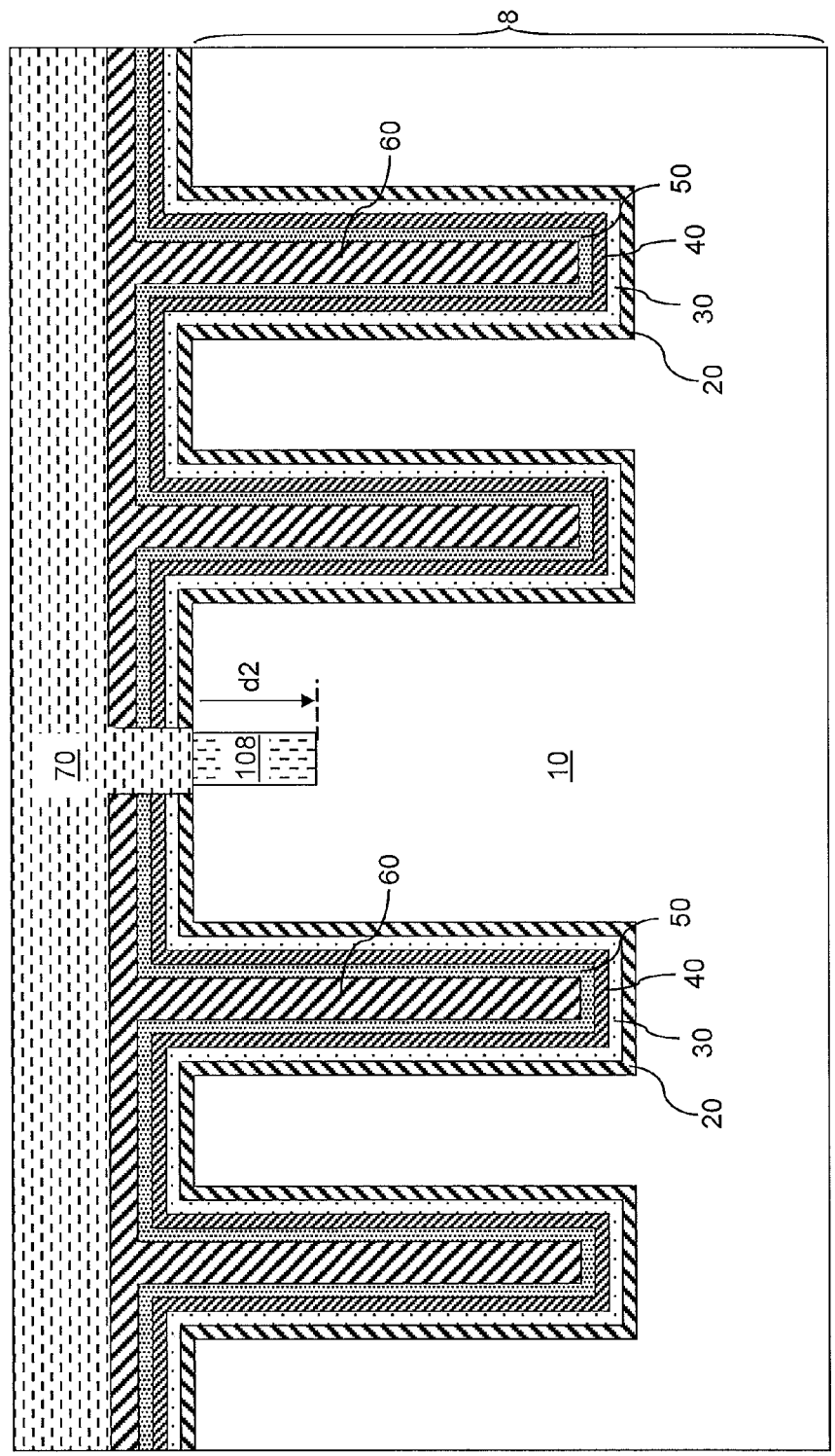
FIGS. 18-24 are sequential vertical cross-sectional views of a third exemplary structure according to a third embodiment of the present disclosure.

Referring to FIG. 18, a third exemplary structure according to a third embodiment of the present disclosure is the same as the first exemplary structure of FIG. 3, and can be formed employing the same processing steps as in the first embodiment.

Figure 19:
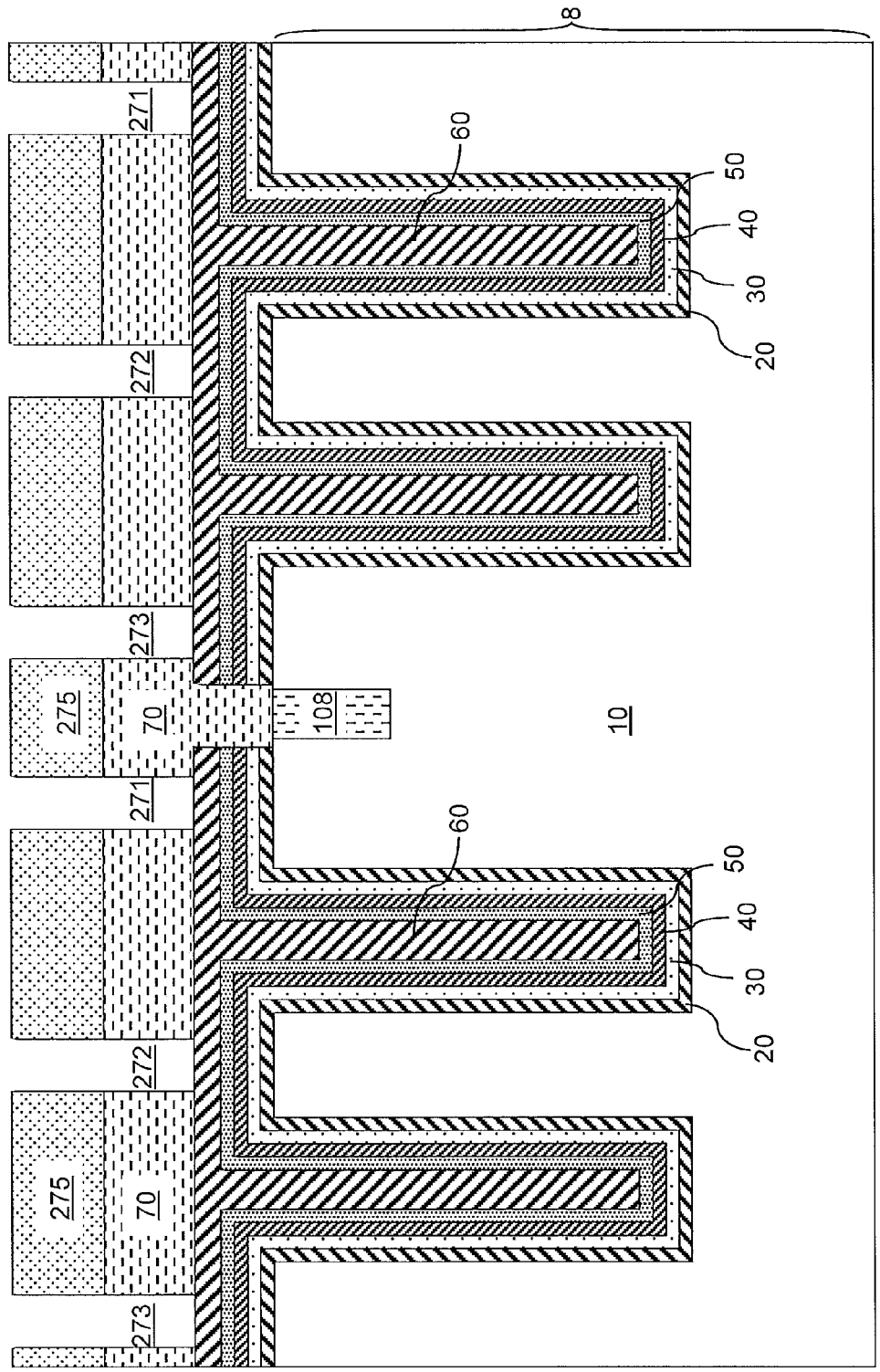

Referring to FIG. 19, a first photoresist layer 275 is applied to the top surface of the contact-level dielectric layer 70 and is lithographically patterned to form openings therein. The portions of the contact-level dielectric layer 70 underlie the openings are removed by an anisotropic etch that employs the first photoresist layer 75 as an etch mask to form at least one first-type via cavity 271, at least one second-type via cavity 272, and at least one third-type via cavity 273 within the contact-level dielectric layer 70. A top surface of the third conductive layer 60 is exposed at the bottom of each of the at least one first-type via cavity 271, the at least one second-type via cavity 272, and the at least one third-type via cavity 273. The first photoresist layer 275 is subsequently removed.

Figure 20:
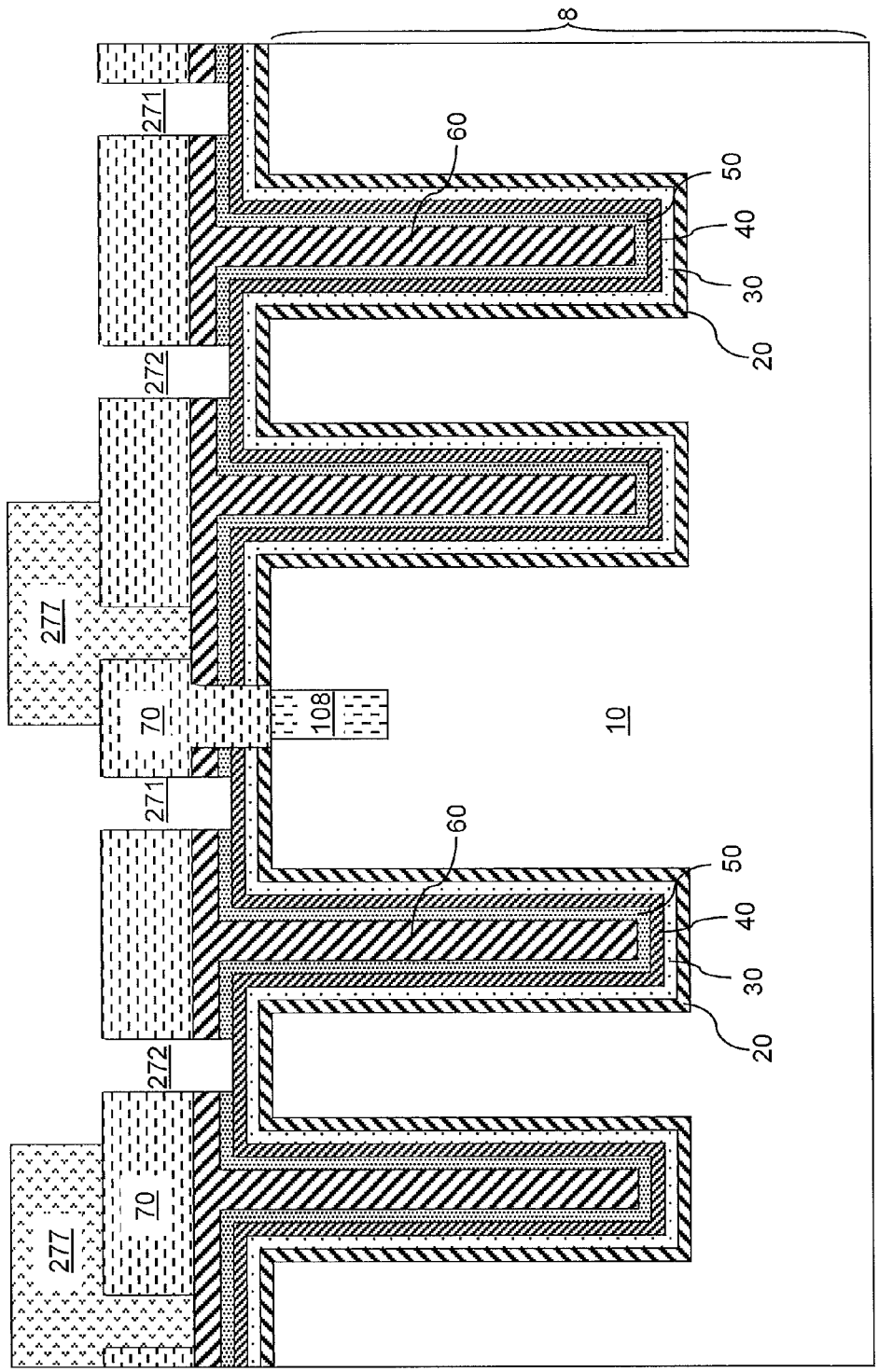

Referring to FIG. 20, a second photoresist layer 277 is applied to the top surface of the contact-level dielectric layer 70 and is lithographically patterned to cover the at least one third-type via cavity 273 (See FIG. 19), while exposing the at least one second-type via cavity 272 and the at least one first-type via cavity 271. The upper portion of the third exemplary structure is exposed to at least one etch that removes exposed portions of the third conductive layer 60 and the second node dielectric layer 50 that underlie the at least one second-type via cavity 272 and the at least one first-type via cavity 271. The second photoresist layer 277 and the contact-level dielectric layer 70 collectively function as an etch mask during the at least one etch, which can include an isotropic etch and/or an anisotropic etch. Exemplary isotropic etch processes include wet etch processes and isotropic dry etch processes, and exemplary anisotropic etch process include reactive ion etch processes. The at least one second-type via cavity 272 and the at least one first-type via cavity 271 are vertically expanded so that a top surface of the second conductive layer 40 is exposed at the bottom of each of the at least one second-type via cavity 272 and the at least one first-type via cavity 271. The second photoresist layer 277 is subsequently removed.

Figure 21:
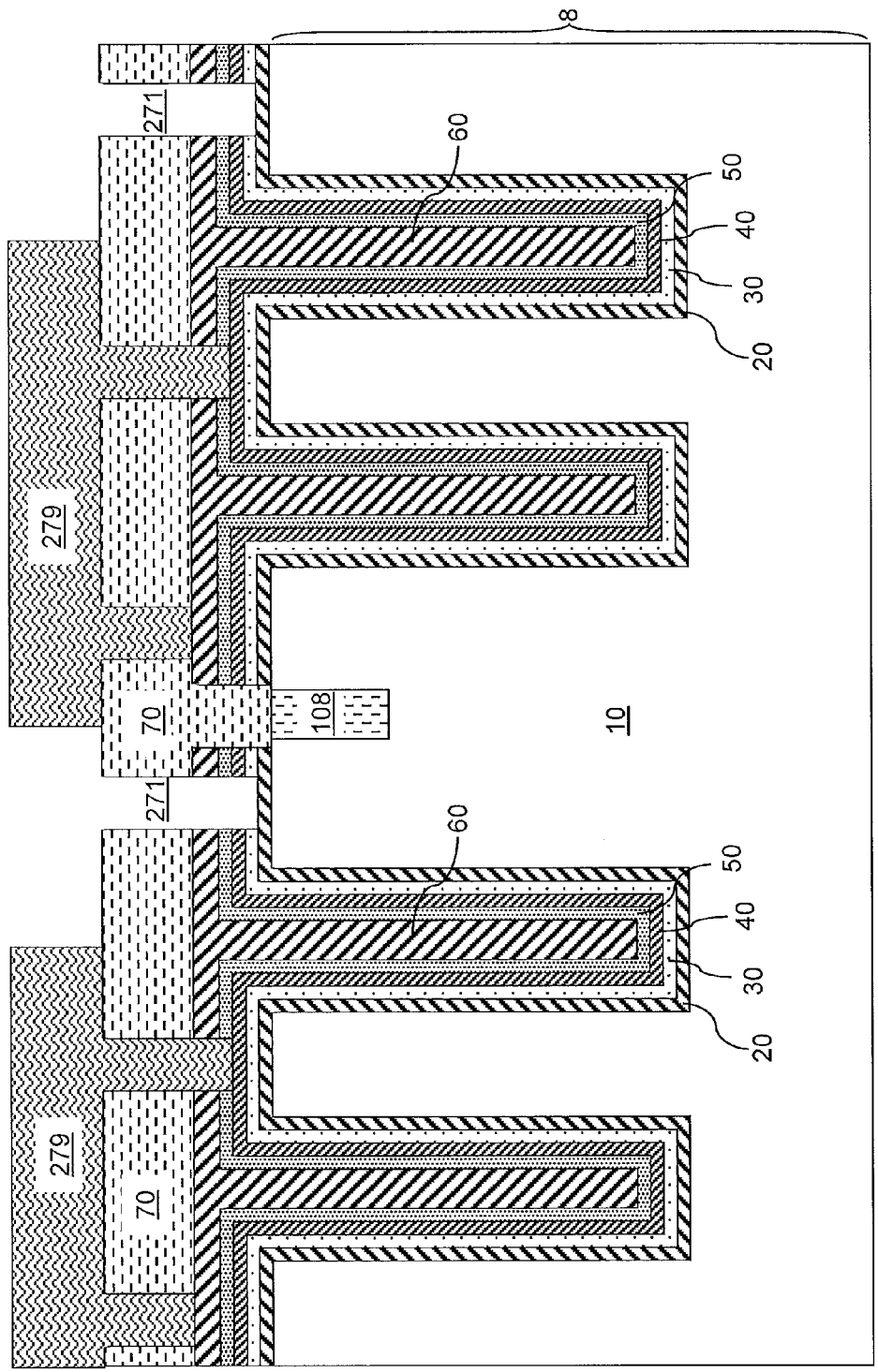

Referring to FIG. 21, a third photoresist layer 279 is applied to the top surface of the contact-level dielectric layer 70 and is lithographically patterned to cover the at least one third-type via cavity 273 and the at least one second type via cavity 272 (See FIG. 19), while exposing the at least one first-type via cavity 271. The upper portion of the third exemplary structure is exposed to at least one etch that removes exposed portions of the second conductive layer 40 and the first node dielectric layer 30 that underlie the at least one first-type via cavity 271. The third photoresist layer 279 and the contact-level dielectric layer 70 collectively function as an etch mask during the at least one etch, which can include an isotropic etch and/or an anisotropic etch. Exemplary isotropic etch processes include wet etch processes and isotropic dry etch processes, and exemplary anisotropic etch process include reactive ion etch processes. The at least one first-type via cavity 271 is vertically expanded so that a top surface of the first conductive layer 20 is exposed at the bottom of each of the at least one first-type via cavity 271.

Figure 22:
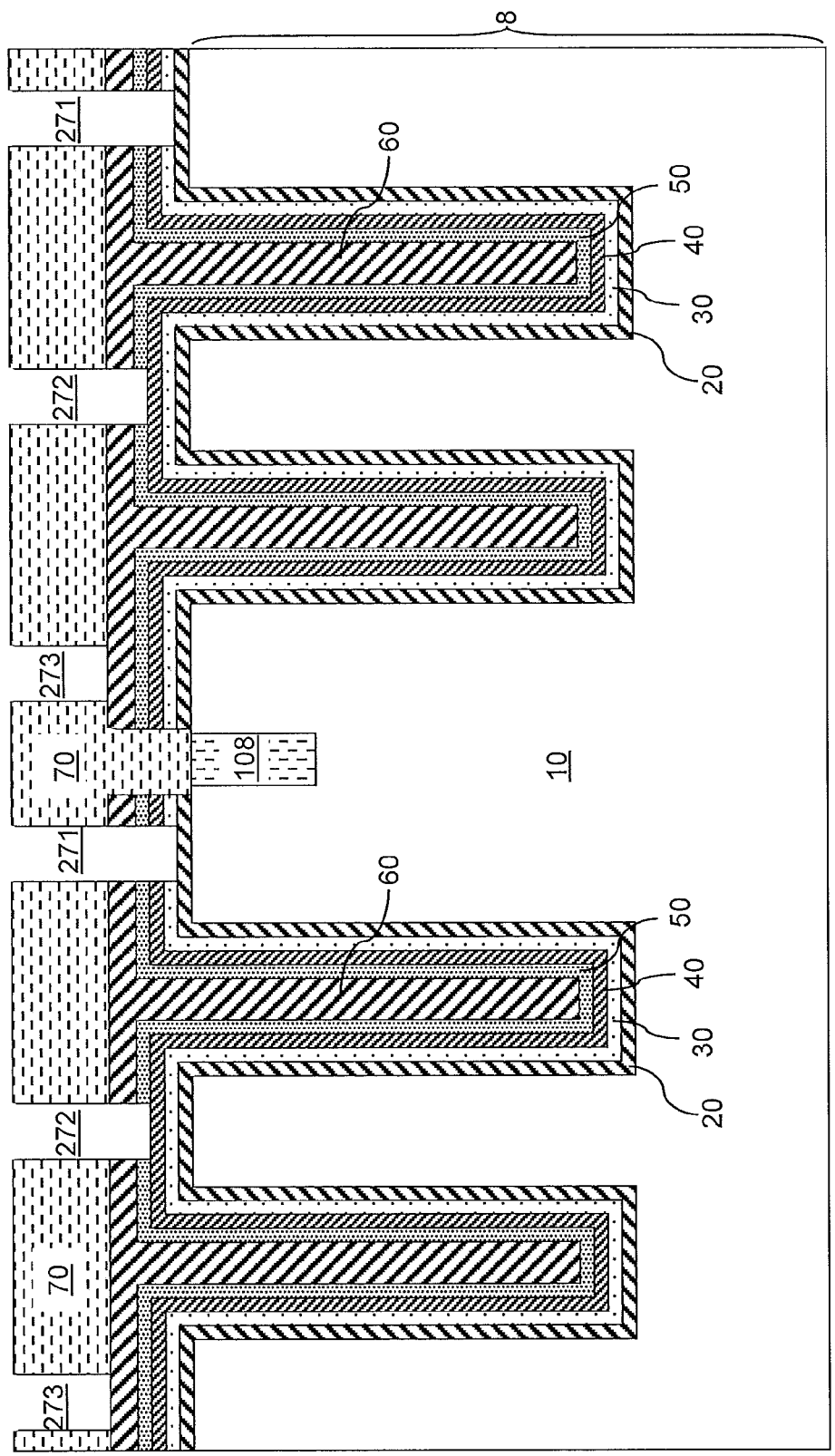

Referring to FIG. 22, the third photoresist layer 279 is subsequently removed.

Figure 23:
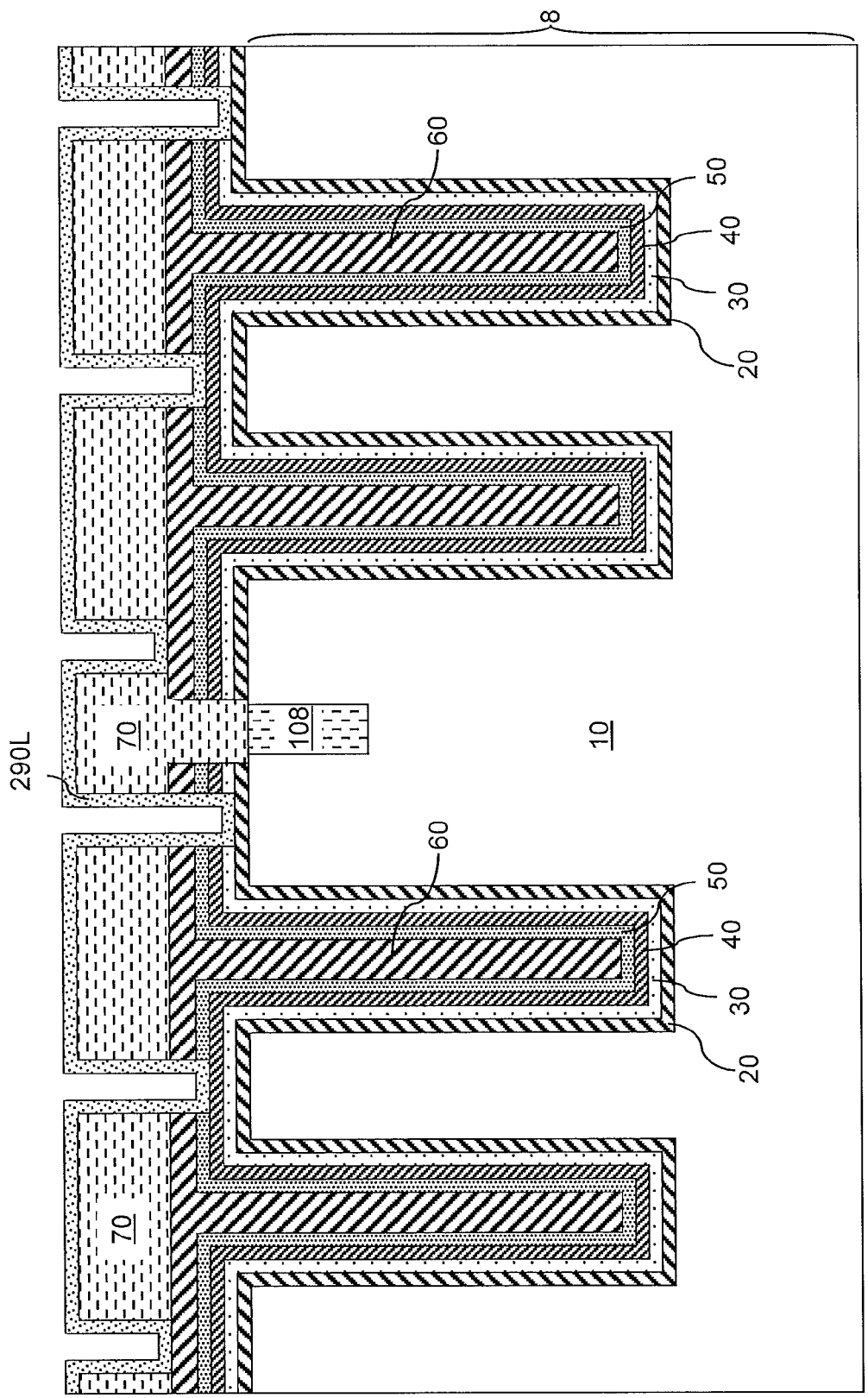

Referring to FIG. 23, a dielectric liner 290L is deposited on the top surface and sidewall surfaces of the contact-level dielectric layer 70, sidewall surfaces of the third conductive layer 60, the second node dielectric layer 50, the second conductive layer 40, and the first node dielectric layer 30, and exposed top surfaces of the first conductive layer 20. The dielectric liner 290L includes a dielectric material such as silicon oxide, silicon nitride, and/or organosilicate glass (OSG). The dielectric liner 290L can be a conformal layer, and can be deposited, for example, by chemical vapor deposition (CVD). The thickness of the dielectric liner 290L, as measured at the bottom of sidewall portions within the via cavities, can be from 3 nm to 50 nm, and typically from 5 nm to 20 nm, although lesser and greater thicknesses can also be employed.

Figure 24:
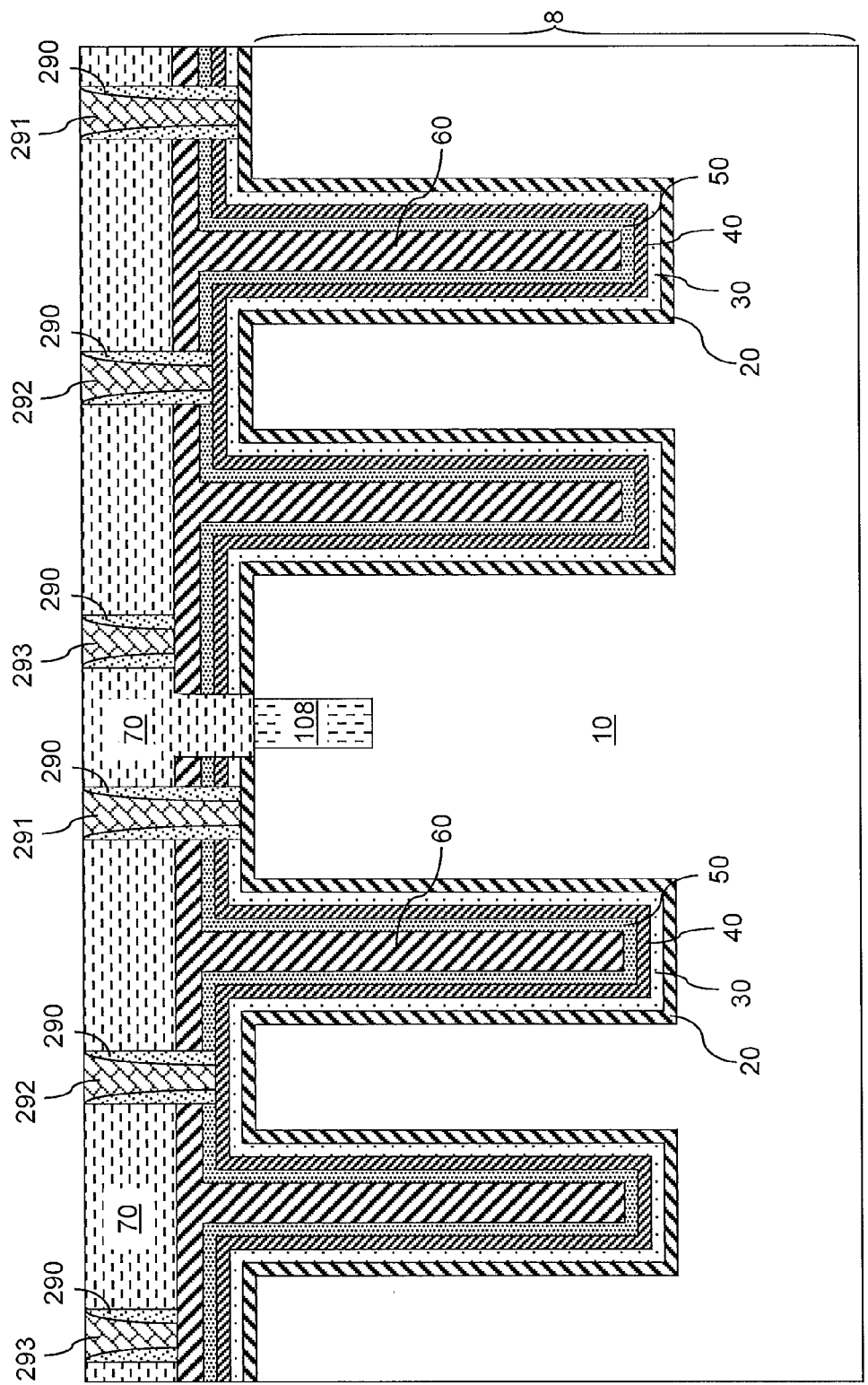

Referring to FIG. 24, an anisotropic etch is performed to remove horizontal portions of the dielectric liner 290L. Each remaining vertical portion of the dielectric liner 290L constitutes a dielectric spacer 290, which covers sidewall surfaces of the contact-level dielectric layer 70, the third conductive layer 60, the second node dielectric layer 50, the second conductive layer 40, and the first node dielectric layer 30. A top surface of the first conductive layer 20, a top surface of the second conductive layer 40, or a top surface of the third conductive layer 60 is exposed at a bottom of in each via cavity.

A conductive fill material is deposited to fill the via cavities that are lined with the dielectric spacers 290. Exemplary methods of depositing the conductive fill material include chemical vapor deposition (PVD), electroless plating, and electroplating. Excess conductive materials above the top surface of the contact-level dielectric layer 70 are removed, for example, by chemical mechanical planarization (CMP), a recess etch, or a combination thereof. The remaining portions of the conductive fill material constitute various contact via structures, which include a first-type contact via structure 291 that contacts a top surface of the first conductive layer 20, a second-type contact via structure 292 that contacts a top surface of the second conductive layer 40, and a third-type contact via structure 293 that contacts a top surface of the third conductive layer 60. Each first-type contact via structure 291 is electrically isolated from the second and third conductive layers (40, 60) by a dielectric spacer 290, and each second-type contact via structure 292 is electrically isolated from the third conductive layer 60 by a dielectric spacer 290.

The first conductive layer 20 and the third conductive layer 60 can subsequently be electrically connected by a metal interconnect structure (not shown) such as at least one metal line and/or at least one metal via in an interconnect-level dielectric layer (not shown). In this case, the first conductive layer 20 and the third conductive layer 60 collectively constitute one node of a capacitor structure, the second conductive layer 40 constitutes another node of the capacitor structure, and the first and second node dielectric layers (30, 50) collectively constitute a node dielectric of the capacitor structure. This capacitor structure effectively doubles the area of the capacitor compared with a prior art structure that employs at least one deep trench of a comparable size and number and a single layer of node dielectric.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a structure including a capacitor structure, said method comprising:

forming a trench in a substrate;
forming a first conductive layer contiguously contacting a bottom surface and sidewalls of said trench;
forming a first node dielectric layer contiguously contacting sidewalls of said first conductive layer;
forming a second conductive layer contiguously contacting sidewalls of said first node dielectric layer;
forming a second node dielectric layer contiguously contacting sidewalls of said second conductive layer;
forming a third conductive layer contiguously contacting sidewalls of said second node dielectric layer; and
patterning a stack of said first conductive layer, said first node dielectric layer, said second conductive layer, said second node dielectric layer, and said third conductive layer, wherein remaining portions of said first conductive layer, said first node dielectric layer, said second conductive layer, said second node dielectric layer, and said third conductive layer collectively form a capacitor structure, wherein sidewalls of said first conductive layer, said first node dielectric layer, said second conductive layer, said second node dielectric layer, and said third conductive layer are vertically coincident with one another after said patterning of said stack.

2. The method of claim 1, further comprising forming a contact via structure that contacts remaining portions of first conductive layer and said third conductive layer after said patterning, wherein said contact via structure is electrically isolated from said second conductive layer.

3. A method of forming a structure including a capacitor structure, said method comprising:
forming a trench in a substrate;
forming a first conductive layer contiguously contacting a bottom surface and sidewalls of said trench;
forming a first node dielectric layer contiguously contacting sidewalls of said first conductive layer;
forming a second conductive layer contiguously contacting sidewalls of said first node dielectric layer;
forming a second node dielectric layer contiguously contacting sidewalls of said second conductive layer;
forming a third conductive layer contiguously contacting sidewalls of said second node dielectric layer;
forming a via cavity that extends through said first conductive layer, said first node dielectric layer, said second conductive layer, said second node dielectric layer, and said third conductive layer;
patterning a stack of said first conductive layer, said first node dielectric layer, said second conductive layer, said second node dielectric layer, and said third conductive layer, wherein remaining portions of said first conductive layer, said first node dielectric layer, said second conductive layer, said second node dielectric layer, and said third conductive layer collectively form a capacitor structure;
laterally removing a material of said second conductive layer selective to materials of said first conductive layer and said third conductive layer, and
forming a contact via structure that contacts remaining portions of first conductive layer and said third conductive layer after said patterning, wherein said contact via structure is formed by filling said via cavity with a conductive material and is electrically isolated from said second conductive layer.

4. The method of claim 1, further comprising:
forming a first contact via structure that contacts a top surface of said third conductive layer and laterally surrounded by a first dielectric spacer;
forming a second contact via structure that contacts a top surface of said second conductive layer and laterally spaced from said third conductive layer by a second dielectric spacer; and
forming a third contact via structure that contacts a top surface of said first conductive layer and laterally spaced from said second conductive layer and said third conductive layer by a third dielectric spacer.

5. The method of claim 1, further comprising forming a metal-semiconductor-alloy region in said substrate, wherein said metal-semiconductor alloy region contacts a peripheral bottom surface of said first conductive layer.

6. A method of forming a structure including a capacitor structure, said method comprising:
forming a trench in a substrate;
forming a first conductive layer contiguously contacting a bottom surface and sidewalls of said trench;
forming a first node dielectric layer contiguously contacting sidewalls of said first conductive layer;
forming a second conductive layer contiguously contacting sidewalls of said first node dielectric layer;
forming a second node dielectric layer contiguously contacting sidewalls of said second conductive layer;
forming a third conductive layer contiguously contacting sidewalls of said second node dielectric layer;
forming at least one first-type via cavity and at least one second-type via cavity through horizontal portions of said first conductive layer, said first node dielectric layer, said second conductive layer, said second node dielectric layer, and said third conductive layer; and
patterning a stack of said first conductive layer, said first node dielectric layer, said second conductive layer, said second node dielectric layer, and said third conductive layer, wherein remaining portions of said first conductive layer, said first node dielectric layer, said second conductive layer, said second node dielectric layer, and said third conductive layer collectively form a capacitor structure.

7. The method of claim 6, further comprising recessing a bottom surface of said at least one first-type via cavity or said at least one second-type via cavity below a topmost surface of said substrate.

8. The method of claim 6, further comprising:
covering said at least one first-type via cavity with a patterned photoresist material, while physically exposing said at least one second-type via cavity; and
performing an etch that removes a conductive material of said second conductive layer selective to conductive materials of said first and third conductive layers from within said at least one second-type via cavity.

9. The method of claim 8, wherein said etch is selective to dielectric materials of said first and second node dielectric layers.

10. The method of claim 8, wherein said etch forms a peripheral cavity that is contiguous with one of said at least one second-type via cavity in each laterally recessed portion of said second conductive layer.

11. The method of claim 8, further comprising:
cover said at least one second-type via cavity with another patterned photoresist material, while physically exposing said at least one first-type via cavity; and
performing another etch that removes said conductive materials of said first and third conductive layers selective to said conductive material of said second conductive layer within the at least one first-type via cavity.

12. The method of claim 11, wherein said another etch is selective to dielectric materials of said first and second node dielectric layers.

13. The method of claim 11, wherein said another etch forms a peripheral cavity that is contiguous with one of said at least one second-type via cavity in each laterally recessed portion of said first and third conductive layers.

14. The method of claim 6, further comprising:
laterally recessing a sidewall of said second conductive layer relative to sidewalls of said first and third conductive layers in said at least one first-type via cavity; and
laterally recessing other sidewalls of said first and third conductive layers relative another sidewall of said second conducive layer in said at least one second-type via cavity.

15. The method of claim 14, further comprising depositing a conductive liner in said at least one first-type via cavity and said at least one second-type via cavity.

16. The method of claim 15, wherein said conductive liner is deposited by a non-conformal method, and does not contact said second conductive layer in said at least one first-type via cavity, and does not contact said first and third conductive layers in said at least one second-type via cavity.

17. The method of claim 14, further comprising:
forming a contact-level dielectric layer over said third conductive layer, wherein said at least one first-type via cavity and said at least one second-type via cavity are formed through said contact-level dielectric layer;
depositing a conductive fill material in said at least one first-type via cavity and said at least one second-type via cavity; and
removing said conductive fill material from above a top surface of said contact-level dielectric layer.

18. The method of claim 1, further comprising patterning said third conductive layer after said patterning of said stack, wherein a remaining portion of said third conductive layer includes sidewalls that are laterally offset from said sidewalls of said first conductive layer, said first node dielectric layer, said second conductive layer, and said second node dielectric layer.

19. The method of claim 1, further comprising:
forming a contact-level dielectric layer over said patterned stack of said first conductive layer, said first node dielectric layer, said second conductive layer, said second node dielectric layer, and said third conductive layer;
forming via cavities having different depths through said contact-level dielectric layer, wherein a top surface of said first conductive layer is physically exposed at a bottom of a first-type via cavity, a top surface of said second conductive layer is physically exposed at a bottom surface of a second-type via cavity, and a top surface of said third conductive layer is physically exposed at a bottom surface of a third-type via cavity;
forming a dielectric spacer in each of said first-type via cavity, said second-type via cavity, and said third-type via cavity; and
forming a contact via structure in each of said first-type via cavity, said second-type via cavity, and said third-type contact via cavity.

20. The method of claim 3, wherein sidewalls of said first conductive layer, said first node dielectric layer, said second conductive layer, said second node dielectric layer, and said third conductive layer are vertically coincident with one another after said patterning of said stack.

* * * * *